United States Patent
Zitlaw

(10) Patent No.: US 10,222,989 B1
(45) Date of Patent: Mar. 5, 2019

(54) MULTIPLE-BANK MEMORY DEVICE WITH STATUS FEEDBACK FOR SUBSETS OF MEMORY BANKS

(71) Applicant: Crossbar, Inc., Santa Clara, CA (US)

(72) Inventor: Cliff Zitlaw, San Jose, CA (US)

(73) Assignee: CROSSBAR, INC., Santa Clara, CA (US)

(*) Notice: Subject to any disclaimer, the term of this patent is extended or adjusted under 35 U.S.C. 154(b) by 482 days.

(21) Appl. No.: 14/749,947

(22) Filed: Jun. 25, 2015

(51) Int. Cl.
*G06F 3/06* (2006.01)
*G11C 7/10* (2006.01)

(52) U.S. Cl.
CPC ............ *G06F 3/061* (2013.01); *G06F 3/0659* (2013.01); *G06F 3/0665* (2013.01); *G06F 3/0688* (2013.01); *G06F 3/0689* (2013.01); *G11C 7/1072* (2013.01)

(58) Field of Classification Search
CPC ............ G06F 13/1647; G06F 12/0246; G06F 13/161; G06F 13/4243; G06F 13/1689
See application file for complete search history.

(56) References Cited

U.S. PATENT DOCUMENTS

| | | | |
|---|---|---|---|
| 5,692,138 A * | 11/1997 | Fandrich | G06F 13/1642 365/189.05 |
| 5,909,703 A | 6/1999 | Hansen et al. | |
| 5,926,642 A * | 7/1999 | Favor | G06F 7/74 709/203 |
| 6,016,537 A | 1/2000 | Hansen | |
| 6,061,749 A | 5/2000 | Webb et al. | |
| 6,081,783 A | 6/2000 | Divine et al. | |
| 6,195,674 B1 | 2/2001 | Eelbourne | |
| 6,260,101 B1 | 7/2001 | Hansen | |
| 8,117,351 B1 | 2/2012 | Mangalindan | |
| 2002/0007451 A1 * | 1/2002 | Cho | G06F 11/3648 712/43 |
| 2002/0053015 A1 | 5/2002 | Tan et al. | |
| 2004/0003209 A1 | 1/2004 | Mitsuishi et al. | |
| 2005/0015539 A1 * | 1/2005 | Horii | G06F 13/1647 711/103 |
| 2005/0172089 A1 * | 8/2005 | Klingman | G06F 9/505 711/154 |

(Continued)

OTHER PUBLICATIONS

"Mobile LPDDR3 Sdram," Invention disclosure conference, 2014, 160 Pages, Micron Technology, Inc., Boise, Idaho.

(Continued)

*Primary Examiner* — Prasith Thammavong
*Assistant Examiner* — Alex G Olson
(74) *Attorney, Agent, or Firm* — Amin, Turocy & Watson, LLP

(57) ABSTRACT

Providing for a multi-bank memory with bank-specific status feedback is described herein. By way of example, the multi-bank memory can be configured to output an availability status, pass/fail status, error correction status, or the like, for subsets of multiple memory banks. In some embodiments, the non-volatile memory can provide global status information, representing a status of all banks commonly in conjunction with bank-specific status information. Further, the subject disclosure provides addressing techniques for identifying particular banks of memory, and obtaining status information for subsets of the memory banks, or performing memory operations on targeted subsets of the memory banks.

33 Claims, 13 Drawing Sheets

(56) References Cited

U.S. PATENT DOCUMENTS

| | | | |
|---|---|---|---|
| 2007/0118713 A1* | 5/2007 | Guterman | G06F 3/0607 711/170 |
| 2008/0082750 A1* | 4/2008 | Okin | G11C 5/04 711/115 |
| 2008/0082751 A1* | 4/2008 | Okin | G06F 13/1668 711/115 |
| 2008/0082766 A1* | 4/2008 | Okin | G06F 13/1684 711/154 |
| 2008/0126682 A1 | 5/2008 | Zhao et al. | |
| 2008/0126712 A1* | 5/2008 | Mizushima | G06F 11/1415 711/141 |
| 2008/0162790 A1 | 7/2008 | Im | |
| 2008/0229034 A1* | 9/2008 | Cauchy | G06T 1/60 711/154 |
| 2009/0138626 A1 | 5/2009 | Le et al. | |
| 2010/0274960 A1 | 10/2010 | Lee et al. | |
| 2010/0332718 A1* | 12/2010 | Farrell | G06F 13/1647 711/5 |
| 2011/0185109 A1 | 7/2011 | Karabatsos | |
| 2012/0173851 A1* | 7/2012 | Lewis | G06F 12/10 712/208 |
| 2012/0236650 A1 | 9/2012 | Nazarian | |
| 2013/0138882 A1* | 5/2013 | Shaeffer | G11C 16/10 711/114 |
| 2013/0227229 A1 | 8/2013 | Ishikawa | |
| 2013/0297864 A1 | 11/2013 | Gupta | |
| 2013/0339829 A1 | 12/2013 | Vargas et al. | |
| 2014/0162470 A1 | 6/2014 | Fricker | |
| 2014/0269139 A1* | 9/2014 | Wang | G11C 11/4063 365/230.03 |
| 2014/0284535 A1 | 9/2014 | Saitoh et al. | |
| 2014/0372670 A1 | 12/2014 | Vasilyuk | |
| 2015/0095565 A1 | 4/2015 | Morris et al. | |
| 2015/0169224 A1* | 6/2015 | Alexander | G06F 3/065 711/162 |
| 2016/0292092 A1 | 10/2016 | Gavens et al. | |
| 2017/0003880 A1 | 1/2017 | Fisher et al. | |

OTHER PUBLICATIONS

"NAND Flash Memory," Invention disclosure conference, 2010, 167 Pages, Micron Technology, Inc., Boise, Idaho.

Office Action for U.S. Appl. No. 14/750,740 dated Jun. 2, 2017, 21 pages.

Office Action for U.S. Appl. No. 14/750,293 dated Jul. 17, 2017, 24 pages.

Office Action for U.S. Appl. No. 14/750,740 dated Jan. 17, 2018, 22 pages.

* cited by examiner

FIG. 6

MODE REGISTER COMMUNICATION PROTOCOL 600

COMMAND ADDRESSES 608

| | CA 00 | CA 01 | CA 02 | CA 03 | CA 04 | CA 05 | CA 06 | CA 07 | CA 08 | CA 09 | CA 10 | CA 11 | CA 12 | CA 13 | CA 14 | CLK EDGE |
|---|---|---|---|---|---|---|---|---|---|---|---|---|---|---|---|---|
| MODE REGISTER WRITE 604 | L | L | L | L | MA 0 | MA 1 | MA 2 | MA 3 | MA 4 | MA 5 | BA 0 | BA 1 | BA 2 | BA 3 | BA 4 | ← |
| | MA 6 | MA 7 | OP 0 | OP 1 | OP 2 | OP 3 | OP 4 | OP 5 | OP 6 | OP 7 | BA 5 | BA 6 | BA 7 | BA 8 | BA 9 | → |
| MODE REGISTER READ 606 | L | L | L | H | MA 0 | MA 1 | MA 2 | MA 3 | MA 4 | MA 5 | BA 0 | BA 1 | BA 2 | BA 3 | BA 4 | ← |
| | MA 6 | MA 7 | X | X | X | X | X | X | X | X | BA 5 | BA 6 | BA 7 | BA 8 | BA 9 | → |

MULTIPLE-BANK MEMORY DEVICE WITH STATUS FEEDBACK FOR SUBSETS OF MEMORY BANKS

TECHNICAL FIELD

This disclosure relates generally to electronic memory, for example, the disclosure describes a memory device comprising multiple memory banks and that provides status feedback for subsets of the multiple memory banks.

BACKGROUND

A recent innovation within the field of integrated circuit technology is two-terminal memory technology. Two-terminal memory technology is contrasted, for instance, with gate-controlled technology in which conductivity between two terminals is mediated by a third terminal, called a gate terminal. Two-terminal memory devices can differ from three terminal devices in function as well as structure. For instance, some two-terminal devices can be constructed between a pair of conductive contacts, as opposed to having a third terminal that is adjacent to a set of conductive terminals. Rather than being operable through a stimulus applied to the third terminal, two-terminal memory devices can be controlled by applying a stimulus at one or both of the pair of conductive contacts. The inventor of the present disclosure is further aware of a variety of two-terminal memory technologies, such as phase-change memory, magneto-resistive memory, as well as others.

One two-terminal memory worth noting is resistive memory. While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

As models of resistive memory technology are tested and results obtained, the results are speculatively extrapolated to memory devices in which resistive memory replaces a conventional memory. For instance, the assignee of the present invention has conducted research related to software models of memory arrays comprising resistive memory instead of complementary metal-oxide semiconductor (CMOS) NAND or NOR memory. Software projections suggest that two-terminal memory arrays can provide significant benefits for electronic devices, including reduced power consumption, higher memory density, advanced technology nodes, or improved performance, among others.

In light of the above, the inventor endeavors to discover applications where two-terminal memory can provide real-world benefits for electronic devices.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various aspects of the present disclosure provide for an electronic memory device comprising multiple banks of memory. In some aspects, the electronic memory device can be configured to provide status feedback for subsets of the multiple banks of memory. In some disclosed embodiments, the electronic memory can comprise multiple status registers, respectively configured to provide status feedback for one of the subsets of the multiple memory banks. In at least one embodiment, a disclosed electronic memory comprises one status register per memory bank, providing independent status feedback for respective memory banks. This embodiment can increase duty cycle of the electronic memory, enabling control over individual memory banks as bank-specific status feedback indicates availability.

In further embodiments, the subject disclosure provides a non-volatile multi-bank memory with bank-specific status feedback. In at least one embodiment, the non-volatile memory can be configured to communicate over a high-speed volatile memory interface, such as a low power double data rate type 3 interface, among others. The non-volatile memory can respectively output an availability status, pass/fail status, error correction status, or the like, for individual memory banks. In further embodiments, the non-volatile memory can provide global status information, representing a status of all banks commonly. In some embodiments, global status information can be available (e.g., passively) or output (e.g., actively) perpetually, and per-bank status can be provided in response to a host query requesting status of one or more identified memory banks.

In one or more embodiments, a multi-bank electronic memory is disclosed comprising multiple status registers. The status registers can be configured to store and output status information for respective subsets of memory banks. In one or more embodiments, the status registers can be individually addressed for status information.

In a further embodiment, an addressing mechanism is provided for querying respective status registers of a set of status registers. In a particular embodiment, an addressing mechanism is disclosed that provides an extended address space for the LPDDR3 communication protocol. Additional addresses can be associated with respective status registers, enabling individual addressability for the set of status registers.

In another embodiment, an alternative or additional mechanism for querying respective status registers of a set of status registers is provided. According to this embodiment, a subset of mode registers on a memory device can be assigned to addressing the set of status registers. The subset of mode registers can be associated with respective identifiers within a host query, each pointing to a different status register. Thus, in response to a host query specifying a particular one of the subset of mode registers, the memory device can reference an associated status register, and output status information for a memory bank(s) of the memory device. In at least one disclosed aspect, an interface communication protocol (e.g., LPDDR3 communication protocol) can be adapted to include the identifiers for the subset of mode registers, utilizing a host query that builds upon a standard protocol.

In yet another embodiment, an alternative or additional mechanism for querying respective status registers of a set of status registers is provided. According to this embodiment, a multi-bank memory comprises a mode register provided as an index register. An ad-hoc addressing scheme can provide an identifier for respective ones of the status register, which identifier(s) can be written to or read from the index register. The memory device, upon receiving a host query for status information, can reference the index register, identify a status register saved in the index register, and return the identifier in reply to the host query. Other host query commands can write different identifiers to the index register, enabling bank-specific status information requests. In addition, this embodiment can be implemented in conjunction with a standard communication protocol, facilitating integration with existing controllers, memory interfaces, and other electronic equipment.

In a further embodiment, the present disclosure provides a memory device. The memory device can comprise a plurality of memory banks respectively comprising a memory array and a data buffer and a first status register configured to store an active status or an idle status for a first subset of the plurality of memory banks. Moreover, the memory device can comprise a second status register configured to store a second active status or a second idle status for a second subset of the plurality of memory banks and a data interface configured to receive commands from a host. Further to the above, the memory device can comprise control logic configured to facilitate implementation of a bank-specific operation at the first status register or the second status register in response to receipt of a host command over the data interface.

In one or more additional embodiments, the present disclosure provides a method for operating a memory device. The method can comprise receiving a command over a host interface, the command comprising command information related to a memory bank of a set of memory banks of the memory device and parsing the command information and determining whether a status register identifier information is indicated by the command. Further, the method can comprise identifying a status register of a set of status registers with reference to the status register identifier information, in response to determining the status register identifier information is indicated by the command. In addition to the foregoing, the method can comprise executing an operation on the status register or on the memory bank in response to receiving the command and identifying the status register.

In further embodiments, the present disclosure can comprise a method. The method can comprise identifying a memory bank of a set of memory banks for obtaining status information. Moreover, the method can comprise generating identifier information indicative of the memory bank and exclusive of a second memory bank of the set of memory banks and generating a status command comprising the identifier information and information configured to instruct the memory device to obtain and return an operation status of the memory bank associated with the identifier information. In addition to the foregoing, the method can comprise sending the status command over an interface to the memory device.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure;

FIG. 6 depicts a diagram of a sample communication protocol providing individual addressability for the set of status registers in a further embodiment;

DETAILED DESCRIPTION

Figure 1:
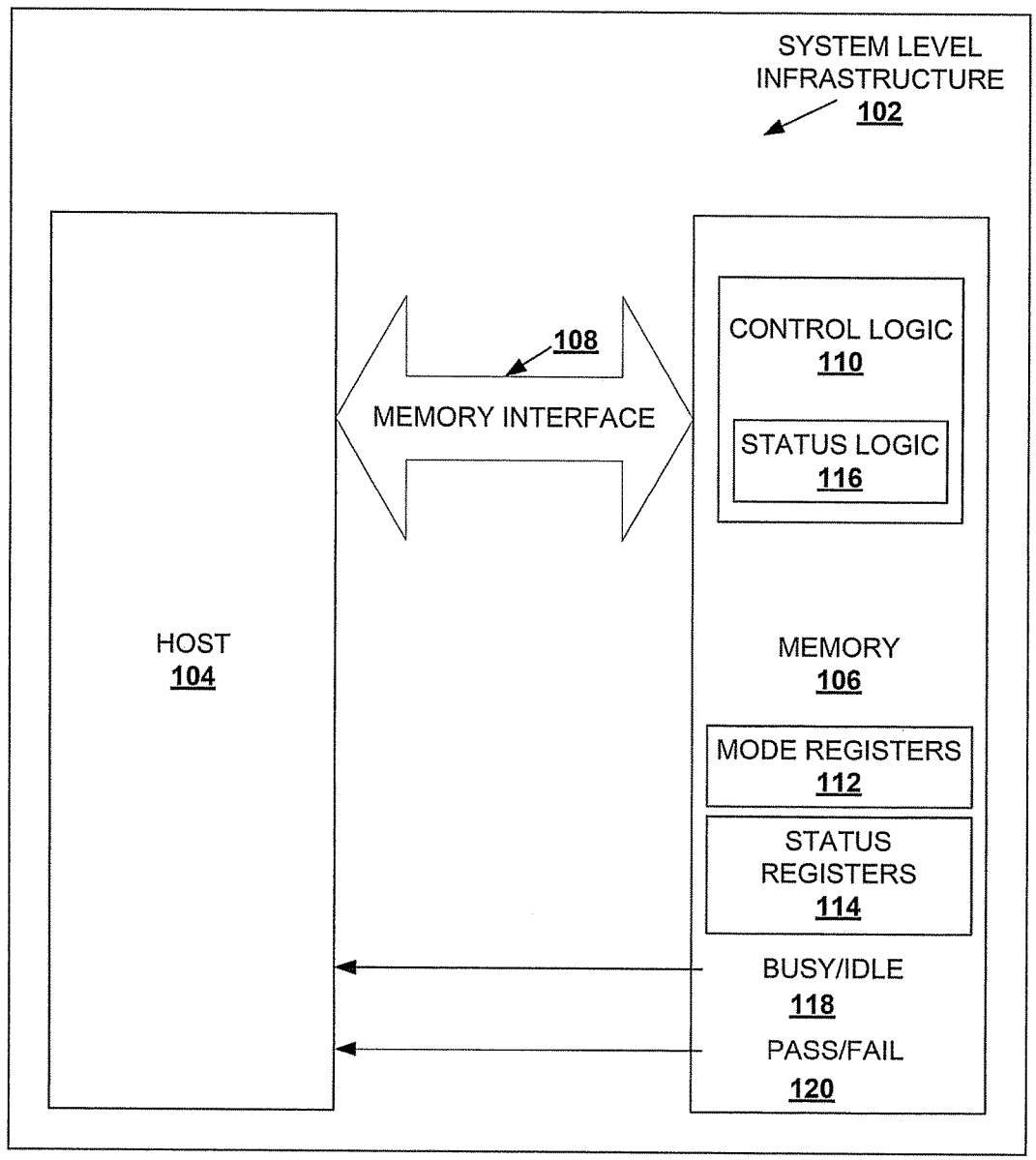
FIG. 1 depicts a block diagram of an example electronic device providing status feedback for multi-bank memory in embodiments of the disclosure.

The present disclosure relates to electronic devices comprising multiple banks of memory, which can be accessed or controlled by a host device to perform memory operations. The host device can access or control the memory banks as a group, or can control respective subsets of the memory banks independently. For example, one or two memory banks (or any other suitable subset) can be assigned a first memory operation, whereas other memory banks can be assigned a second memory operation that can be performed at least in part concurrent with the first memory operation. This can be accomplished, for instance, where the first memory operation and second memory operation target different subsets of memory (e.g., different memory banks, different subsets of different memory banks, and so on), and the subsets of memory have sufficient circuitry to operate independently. In theory, a larger total memory capacity facilitates greater capacity for parallel operation, subject to the circuitry involved in carrying out these operations on subsets of the memory. In some embodiments, the multiple memory bank arrangement facilitates significant parallel operation, for instance with an electronic device provided with sufficient per-bank circuitry to enable respective memory banks to operate at least in part independently from other memory banks.

In further disclosed embodiments, a multi-bank memory device is provided that can be configured to generate or output status information pertaining to subsets of the memory banks. Status information for a subset of the memory banks can be in response to a host query identifying that subset, in some embodiments. In other embodiments, the multi-bank memory device can provide subset-specific status information in reply to a general host command (e.g., involving a set of memory operations distributed among the multiple memory banks). In still other embodiments, the multi-bank memory device can provide a global output in addition to subset-specific status information. In various disclosed embodiments, a subset of the multiple memory banks can include as few as one memory bank. For instance, in various embodiments, bank-specific status information can be generated by disclosed memory devices for each respective memory bank, and output in response to a query, upon completion of an operation(s) by a memory bank, or the like, or a suitable combination of the foregoing. However, the subject disclosure is not so limited, and status information can be generated or reported for a plurality of memory banks (e.g., two memory banks, three memory banks), or can be generated and reported for non-homogenous numbers of memory banks (e.g., one report can include status information for one memory bank, and a second report can include status information for two memory banks, and so on).

By providing status information for subsets of multiple memory banks, a host device can increase a duty cycle of multi-bank memory, achieving higher memory efficiencies. For instance, where only global status information is available for a set of memory banks, a host device may be programmed to wait for all memory banks to complete existing operations before initiating a new operation. This could lead to significant downtime as some memory banks, having completed queued memory operations, are idle while other memory banks continue with queued operations. On the other hand, providing greater granularity of feedback information could enable a host to issue new commands to subsets of memory banks as they become idle, and facilitate much more efficient utilization of multi-bank memory resources.

In some embodiments, a disclosed memory device can generate and output feedback information for subsets of memory banks, independent of other subsets thereof. In further embodiments, the feedback information can comprise a pass fail status of respective subsets of memory banks, a busy/idle status of the respective subsets, an error correction code (ECC) status of respective subsets, or the like, or a suitable combination thereof. In one or more additional embodiments, feedback information can comprise a buffer status of respective subsets of memory banks. Buffer status could include, for instance, a number, type, etc., of operations buffered at one or more memory banks. In still other embodiments, global status information can be provided in addition to more granular status information related to subsets of memory banks. In one embodiment, global status information can be provided by a dedicated bus pin(s) that is high or low depending on status of all memory banks. In another embodiment, a mode register or configuration register of a memory device can be programmed to output the global status information.

In further embodiments, the subject disclosure provides a memory device having multiple status registers. The multiple status registers can be configured to store or output status information for subsets of multiple memory banks of the memory device. In additional embodiments, the subject disclosure provides an addressing mechanism for identifying respective ones of the multiple status registers. In one embodiment(s), the addressing mechanism can comprise a set of bits included within a communication protocol for distinguishing subsets of the status registers. In another embodiment(s), the addressing mechanism can comprise a mapping between respective ones of a set of mode registers (e.g., that are unused by other functions of the memory device) or configuration registers, and the set of status registers. In yet another embodiment(s), the addressing mechanism can comprise a writable index register and an ad-hoc set of identifiers for the status registers, which can be written to the index register to identify a status register upon which to perform an associated status command. These and other embodiments are described in more detail throughout this specification.

In further embodiments, disclosed electronic devices can comprise random access memory (RAM), in which performance of a memory operation is largely independent of location of physical cells targeted by the memory operation. Other embodiments may employ a quasi random access memory, in which some memory operations may be, as a practical matter, partially location dependent, whereas other memory operations are independent of location. For instance, some memory technologies can perform true random access read operations, whereas write operations exhibit partial location-dependent performance. More generally, in addition to RAM or quasi random access memory, disclosed electronic devices can comprise read only memory, one-time programmable memory, program-erase memory, fully rewritable memory, and so forth, or suitable combinations of the foregoing.

In still other embodiments, the present disclosure provides electronic devices having non-volatile memory, such as a non-volatile two-terminal memory (e.g., resistive-switching memory, phase-change memory, magneto-resistive memory, conductive-bridging memory, etc.), a NAND memory, a NOR memory, or the like. In at least some embodiments, an electronic device can comprise a volatile memory, such as dynamic random access memory (DRAM), double data rate DRAM (DDR-DRAM), and so forth. In further embodiments a combination of the foregoing memory technologies can be provided for a disclosed electronic device.

Referring now to the drawings, FIG. 1 illustrates a block diagram of an example electronic device 100 according to one or more aspects of the present disclosure. Electronic device 100 can be a single hardware device, such as a computer board (e.g., motherboard, graphics card, etc.) that can be integrated with other electronic components (e.g., external communication interface, graphics card, wireless communication hardware, display device, user input/output device, and so forth) in some embodiments. In other embodiments, electronic device 100 can comprise separate components that communicate over a wired or wireless interface, such as a communication cable, network, wireless interface, and so on.

Electronic device 100 can comprise a system level infrastructure 102 for performing electronic functions and operations of electronic device 100. System level infrastructure 102 can comprise a host 104 communicatively connected to a memory 106 by a memory interface 108. Host 104 can comprise a computer having computing hardware and software (e.g., firmware, etc.), a processor (e.g., a central processing unit, a graphics processing unit, and so forth) with or without embedded memory (e.g., cache memory, etc.), or the like. In some embodiments, host 104 can be a memory controller configured to perform memory operations on memory 106. Further, host 104 can be programmed to operate according to a communication protocol associated with memory interface 108. Such a communication protocol can be a standard protocol (e.g., a low power double data rate type 3 (LPDDR3) protocol), or a non-standard protocol (e.g., a modified LPDDR3 protocol such as depicted at FIG. 6, infra, an ad-hoc protocol, etc.). In at least one embodiment, host 104 can be a dynamic random access memory (DRAM) controller or a modified DRAM controller (e.g., programmed to operate with non-DRAM memory), though the subject disclosure is not so limited.

Memory 106 can comprise multiple banks of memory (not depicted, but see FIGS. 2, 3 and 4, infra) that can perform memory operations at least in part independently. In some embodiments, each memory bank can perform a memory operation independent of other memory banks. In other embodiments, subsets of memory banks can perform one or more memory operations independent of one or more other subsets of the memory banks. Further, respective memory banks can comprise a non-volatile memory in some embodiments. For example, memory 106 can comprise non-volatile two-terminal memory, such as resistive-switching memory, phase-change memory, conductive-bridging memory, and so forth. In at least one embodiment, memory 106 can comprise one or more memory banks having a volatile memory, such as DRAM or the like. In at least one other embodiment, a combination of the foregoing can be provided.

In addition to the foregoing, memory 106 can comprise control logic 110 configured to receive commands from host 104 over memory interface 108, and implement the commands at memory 106. Control logic 110 can also be configured to transmit data over memory interface 108 to host 104. Data transmitted by control logic 110 can be in response to a command from host 104 (e.g., a query), can be independent of a command from host 104, or partly independent from such command and partly in response to the command. For instance, data retrieved from a memory read operation can be transmitted to host 104 over memory interface 108 in response to a read command issued by host 104, whereas global status information related to operations performed by memory 106 in general can be output (or made available) independent of such command (e.g., over memory interface 108 or by another interface, such as an output-specific bus, or via a dedicated one of a set of mode registers 112).

Memory 106 can additionally comprise a set of mode registers 112 (also referred to herein as configuration registers) and a set of status registers 114. Mode registers 112 can be set (e.g., written to) by host 104 to program memory 106 for selective functionality. For instance, host 104 write one or more configuration values to respective ones of mode registers 112 to configure memory 106 to operate according to a set of predetermined definitions, rules, etc., associated with the configuration value(s). Additionally, one or more of mode registers 112 can be associated with initiating or controlling status-related functionality of memory 106, such as addressing, accessing, writing to or obtaining status information from a set of status registers 114.

Status registers 114 can be configured to obtain and store status information pertaining to the multiple memory banks of memory 106. Respective ones of status registers 114 can be assigned to subsets of the multiple memory banks. In one embodiment, status registers 114 can include a status register for each of the multiple memory banks, which respectively track or output status information for individual ones of the memory banks (e.g., see FIGS. 2, 3, infra). In other embodiments, respective ones of the status registers 114 can be assigned to subsets of the memory banks, where respective subsets can comprise one or a plurality of the multiple memory banks of memory 106 (e.g., see FIG. 4, infra).

In various disclosed embodiments, status registers 114 can be configured to store status information related to operations of associated memory banks. In some embodiments, respective ones of status registers 114 can track an operational status of respective associated memory bank(s), and store a busy status if a memory operation(s) is currently being performed by (or queued to be performed by) the associated memory bank(s), and can store an idle status if the associated memory bank(s) has no current operation or queued operation. In further embodiments, respective ones of status registers 114 can track a pass fail status of respective associated memory bank(s), and store a pass status if no memory read or write error is detected, and store a fail status if a memory read or memory write error is detected for the associated memory bank(s). In another embodiment, status registers 114 can track an error correction code (ECC) status for the associated memory bank(s), and store an ECC clear status if no ECC error is identified for the associated memory bank(s), and store an ECC error status if the ECC error is identified for the associated memory bank(s). In other embodiments, alternative or additional status information can be stored by status registers 114, where suitable, and the present disclosure is not limited to the status information provided above.

Status information stored by one or more of status registers 114 can be output to host 104 over memory interface 108. The status information can be provided in response to a query by host 104 provided over memory interface 108 and decoded by control logic 110, as one example. Such a query can identify one or more of status registers 114 from which status information is to be obtained, in an embodiment(s). In another embodiment(s), the query can identify a subset of the status information—such as pass/fail status information, busy/idle status information, ECC pass/fail status information, or the like, or a suitable combination thereof—to be provided in response to the query.

In further embodiments, an addressing mechanism is provided that can specify respective identifiers to differentiate subsets of status registers 114. The identifiers can be employed by a host query to target subsets of status registers 114 for status commands. Such status commands can include: read currently stored status information, read a specified subset of currently stored status information, write to an identified status register(s) (e.g., to force a pass/fail status, busy/idle status, etc., to erase a stored failure status, and so on), reset an identified status register(s) (e.g., to remove all stored data, reset to factory settings, or the like), or the like, or a suitable combination thereof. In some embodiments, the addressing mechanism can be integrated with a communication protocol employed for communication over memory interface 108. In at least one embodiment, the addressing mechanism can comprise an extension to command address bits of a standard communication protocol (e.g., an extension of a LPDDR3 protocol), where extended address bits specify identifiers for respective subsets of status registers 114. In another embodiment, the addressing mechanism can comprise a subset of mode registers 112 mapped to respective subsets of status registers 114, in which an address for one of the subset of mode registers 112 is mapped to an associated subset of status registers 114. In yet another embodiment, the addressing mechanism can comprise an ad-hoc set of identifiers mapped to respective subsets of status registers 114, which can be written to a status-index register of one of mode registers 112 (referred to hereinafter as an index register, status register pointer, or the like). In this embodiment(s), memory 106 can read a current identifier stored in the index register, and perform memory operations on the subset of status registers 114 indicated by the current identifier.

According to one or more additional embodiments, a subset of mode registers 112 can be established as a status-related mode register(s). A command addressed to the status-related mode register can be decoded according to a set of status logic 116. Status logic 116 can be triggered in response to a command issued by host 104 that is addressed to the status-related mode register. Upon receiving such a command, control logic 110 can reference status logic 116 and enable definitions, rules, addresses, commands, etc., associated with status logic 116. In some embodiments, status logic 116 can provide a mapping between an ad-hoc addressing system and respective subsets of status registers 114. In other embodiments, status logic 116 can provide definitions or rules for a set of status-related commands supported by memory 106, and instructions for performing such status-related commands and decoding identifier information associated with determining a target status register(s) 114 for such status-related commands. Accordingly, upon receiving the host command addressed to the status-related mode register, control logic can: decode an identifier for a target status register(s) 114 according to an addressing mechanism for status registers 114, obtain a command value included with the host command and determine a status command associated with the command value according to status logic 116, and implement the status command on the target status register(s) 114 (e.g., to query a status register(s), write to a status register(s), erase a status register(s), or reset a status register(s), or the like).

In one or more additional embodiments, memory 106 can comprise global status information. The global status information can be a combined status of all memory banks of the multiple memory banks of memory 106, in some embodiments. In various embodiments, combined status information can comprise a pass/fail status 120, a busy/idle status 118, an ECC status (not depicted), or the like, or a suitable combination of the foregoing, for the multiple memory banks. In one embodiment, global status information can comprise one or more physical pins (e.g., an output pin) on a bus, that is connected via an OR logic array to respective status registers 114 of each of the memory bank. For instance, global busy/idle 118 can be an output pin that is connected to respective busy/idle outputs of each of status registers 114 by the OR logic array, and pass/fail 120 can be a second output pin that is connected to respective pass/fail outputs of each of status registers 114 by the OR logic array (or a second logic array). Other global output (e.g., ECC output, etc.) can be connected to associated outputs of each of the status registers 114 by a similar mechanism. According to this embodiment, global output information can be actively provided to host 104, and not subject to an external query. Active provisioning of global status information can be useful to trigger an interrupt or other remedial action in response to detection of an error, as one example. In other embodiments, global status information can be provided by one or more of mode registers 112 assigned to provide the global status information. In this embodiment, global status information can be queried by host 104, and utilized to identify an error, operation status, and so forth. The mode register implementation of global status information can be provided without physical changes to standard memory interfaces (e.g., a LPDDR3 interface), making global status information available with minimal or no implementation overhead. In at least one embodiment, the subject disclosure can provide a similar global status information modality, or a suitable combination of the foregoing.

Figure 2:
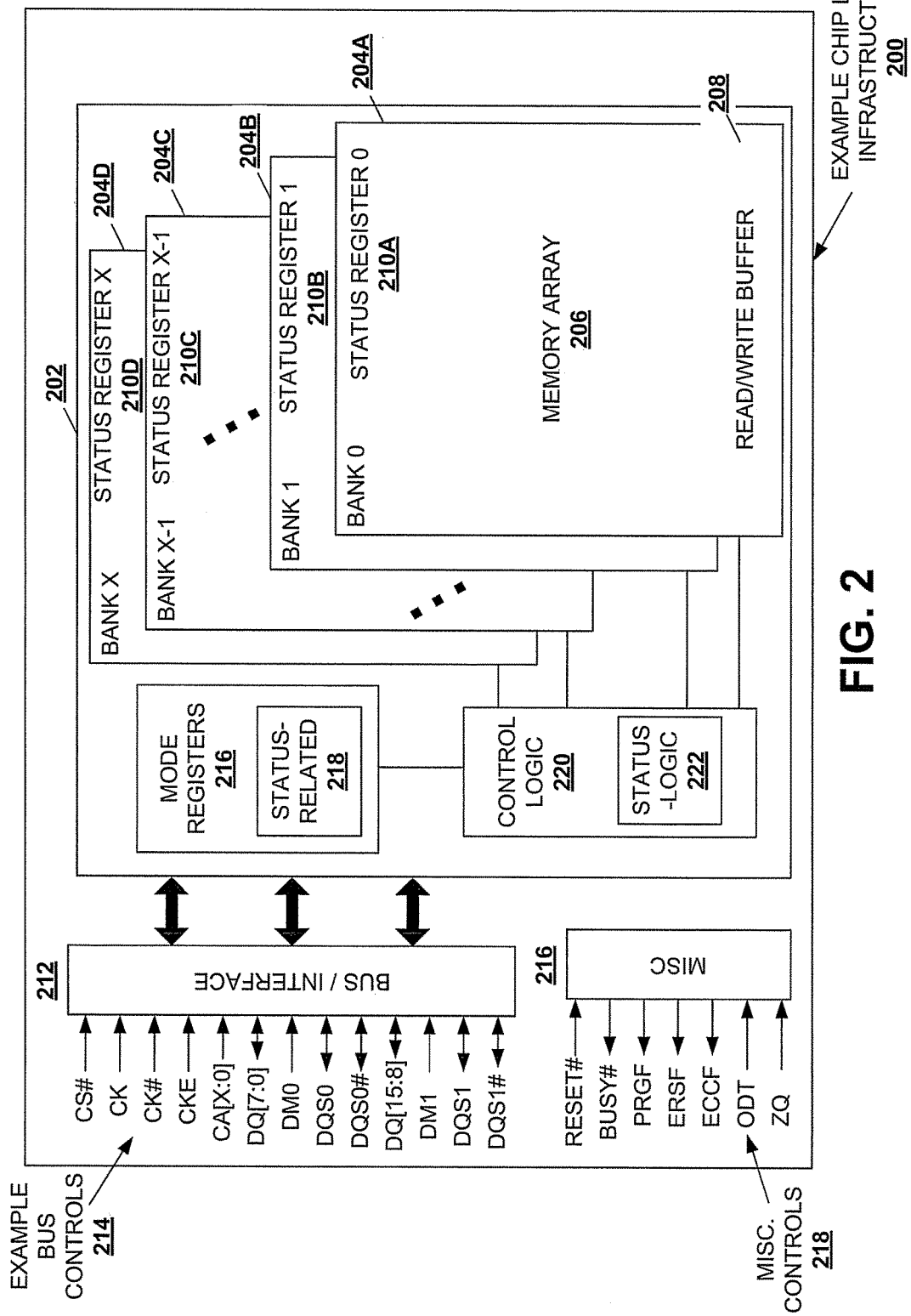
FIG. 2 illustrates a block diagram of an example electronic system providing bank-specific status feedback for multi-bank memory, in an embodiment.

FIG. 2 illustrates a block diagram of an example chip level infrastructure 200 for an electronic device according to alternative or additional embodiments of the present disclosure. Chip level infrastructure 200 can comprise a memory 202 having multiple banks of memory, including memory $bank_0$ 204A, memory $bank_1$ 204B, . . . , memory $bank_{X-1}$ 204C and memory $bank_X$ 204D (referred to herein collectively as memory banks 204A-204D), where X is a suitable positive integer greater than 1. Respective memory banks 204A-204D can respectively comprise an array of memory cells (memory array) 206, a read/write buffer for queuing received commands, as well as data to be written to memory array 206 or data to be read out from memory array 206, in some embodiments. Further to the above, respective memory banks 204A-204D can comprise an associated status register, including status $register_0$ 210A (of memory bank 204A), status $register_1$ 210B (of memory bank 204B), . . . , status $register_{X-1}$ 210C (of memory bank 204C) and status $register_X$ 210D (of memory bank 204D), collectively referred to as status registers 210A-210D.

Status registers 210A-210D can be configured to store status information pertaining to respective memory banks 204A-204D. Status information can include, for instance, program pass/fail status of an associated one of memory banks 204A-204D, read pass/fail status of an associated one of memory banks 204A-204D, busy/idle status of an associated one of memory banks 204A-204D, ECC error status of an associated one of memory banks 204A-204D, or the like, or a suitable combination of the foregoing. For instance, in response to a program failure for memory bank 204A, status register 210A can store a program failure indication (e.g., set a program fail bit high, setting the program fail bit low, etc.) for memory bank 204A. A host can retrieve this information through status commands (see below) directed at status register 210A. In some embodiments, a global status output can also indicate that a program failure has taken place for memory 202, triggering the host to query status registers 210A-210D to discover the program failure. Analogous relationships can govern setting of read failure indication, ECC error indication, and busy/idle state indication.

Further to the above, chip level infrastructure 200 can comprise a bus/interface 212 facilitating communication between memory 202 and a host (not depicted). In one embodiment, bus/interface 212 can be an LPDDR3 interface. In another embodiment, bus/interface 212 can be a modified LPDDR3 interface (e.g., comprising more, or fewer, command and address pins, as one example). In yet another embodiment, bus/interface 212 can be a non-standard interface, or can comprise or be derived from another bus standard. In various embodiments, bus/interface 212 can comprise a set of bus controls 214 to facilitate external (e.g., host) control of memory 202 (e.g., see FIG. 5, infra). Such functions can include retrieving configuration information from memory 202, configuring memory 202, issuing commands to memory 202 according to an existing configuration, retrieving status information from status registers 210A-210D, retrieving stored data information from memory array 206 (or other memory arrays of other memory banks 204A-204D—not depicted), and so forth, as well as other suitable functions related to controlling operations of memory 202 not specifically described.

Figure 5:
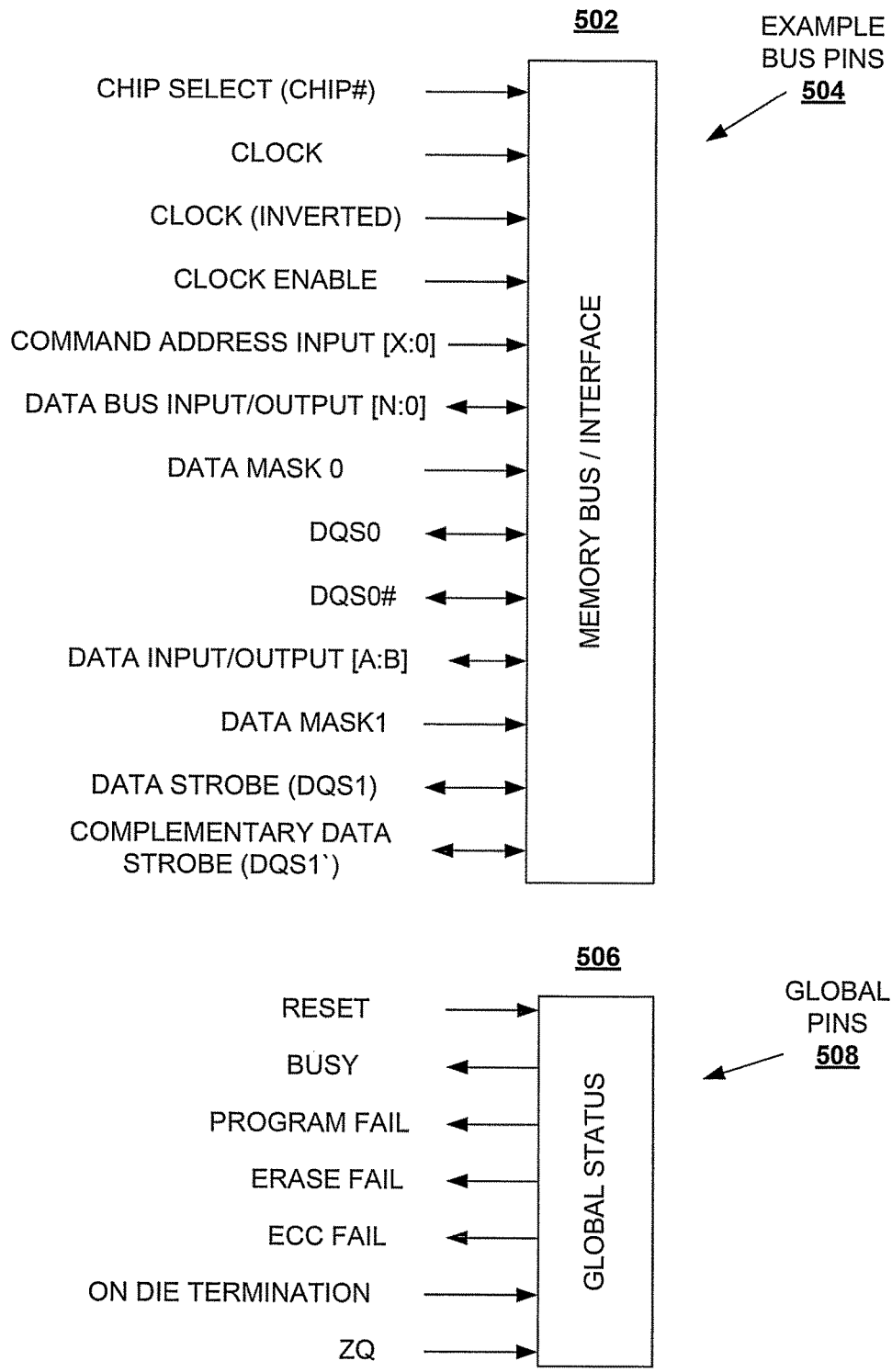
FIG. 5 illustrates a block diagram of a sample bus interface and associated controls for a disclosed memory device, in an embodiment.

In further embodiments, a communication protocol associated with bus/interface 212 can govern definitions, operations, and rules associated with information transmitted over bus/interface 212, including relationship between such information, definitions, operations and rules relative to respective input/output pins of bus/interface 212 (e.g., see FIGS. 5 and 6, infra). In one or more embodiments, the communication protocol can provide an addressing mechanism to differentiate respective subsets of status registers 204A-204D (e.g., individual status registers, pairs of status registers, or other suitable subset) from other subsets thereof. In at least one embodiment, bus/interface 212 can comprise an extended set of command and address pins (e.g., in addition to those provided in the LPDDR3 protocol) that can be utilized, at least in part, as status register identifier bits to identify a target subset of status registers 204A-204D. In response to receiving a status-related command then, memory 202 can perform the status-related command on the target subset of status registers 204A-204D specified by the status identifier bits.

In a further embodiment, a set of mode registers of memory 202 can include a mode register designated as a status-related mode register 218. In response to receiving a command comprising a mode register address of status-related mode register 218, control logic 220 can trigger application of status logic 222 for command values and other information associated with such command. For instance, the status logic 222 can store definitions, operations and rules associated with mapping a set of status register identifiers to the subsets of the status registers 204A-204D, decoding the status register identifiers, mapping command value information to a set of status operations performed in relation to status registers 204A-204D, decoding the command value information, and carrying out an appropriate one of the status operations in response to decoding an associated one of the command values from the command. One example communication protocol for incorporating such information into a command on bus/interface 212 is specified at FIG. 6, infra, though the subject disclosure can employ other communication protocols, including a standard LPDDR3 protocol, a non-standard protocol, and so on.

In an embodiment(s), chip level infrastructure 200 can comprise a global status bus 216. Global status bus 216 can comprise a set of miscellaneous controls 218 related to outputting information related to all of memory banks 204A-204D. For instance, miscellaneous controls 218 can be physical input/output pins on global status bus 216, in an embodiment. Global status bus 216 can output a busy/idle status for memory banks 204A-204D, which indicates the busy status when any of memory banks 204A-204D are performing a memory operation or have a memory operation queued in an associated read/write buffer 208. Additionally, global status buffer 216 can comprise a program fail output, which can indicate a program failure of any program operation associated with memory banks 204A-204D fails to properly write data to an associated memory array 206. Further, global status buffer 216 can comprise an erase fail output, which can indicate an erase failure in response to any erase operation associated with memory banks 204A-204D failing to properly erase data from an associated memory array 206, and can comprise an ECC fail output that can indicate an error correction code in response to identifying a read error for any of memory banks 204A-204D in conjunction with reading data from an associated memory array 206. In further embodiments, global status bus 216 can comprise a reset input for resetting busy/idle, program fail, erase fail or ECC fail indicators. In still other embodiments, global status bus 216 can comprise an on die termination (ODT) input (utilized e.g., to enable chip level infrastructure 200 to enable/disable and turn on/off termination resistance for one or more pins on global status bus 216 or bus interface 212, according to specified mode register settings), or a ZQ input (utilized e.g., as a drive strength calibration of pin outputs for global status bus 216 or bus interface 212), or both.

In an alternative or additional embodiment, global status information can be provided by a global status-related one of mode registers 216 (not depicted—referred hereinafter as a global status mode register). The global status mode register can have a mode register address for differentiating the global status mode register from other mode registers 216. In response to receiving a command comprising the global status mode register address, control logic 220 can access global status logic (not depicted), which can be included with status logic 222 or separate within control logic 220. Global status logic can provide definitions, operation and rules for accessing, reporting, resetting, etc. global status information as described above, in response to suitable global status commands.

Figure 3:
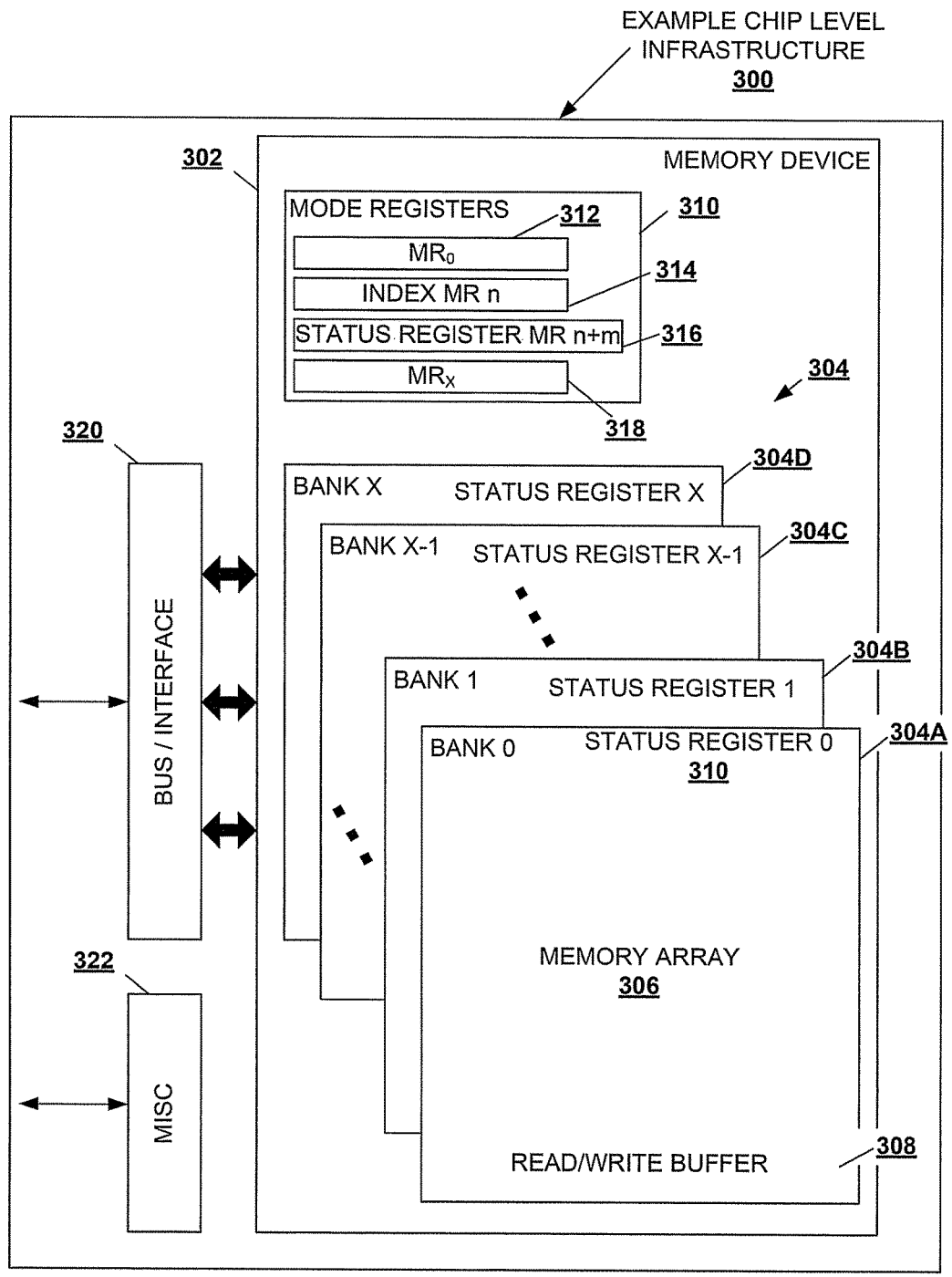
FIG. 3 depicts a block diagram of a sample memory device that provides individual addressability for a set of status registers, in a further embodiment.

FIG. 3 depicts a block diagram of a chip level infrastructure 300 for an electronic device, according to alternative or additional embodiments of the present disclosure. Chip level infrastructure 300 can comprise a memory device 302 connected to a bus/interface 320, and in some embodiments a miscellaneous bus 322, for communication with an external device. The external device can be any suitable device, such as a host device(s), a memory controller(s), a processor(s), a central processing unit(s), a graphics processing unit(s), a virtual device(s), or the like, or a suitable combination of the foregoing. Additionally, memory device 302 can comprise multiple memory banks 304, including memory bank$_0$ 304A, memory bank$_1$ 304B, . . . , memory bank$_{X-1}$ 304C and memory bank$_X$ 304D (referred to collectively as memory banks 304A-304D), where X is a suitable integer greater than 1.

Individual memory banks 304A-304D can respectively comprise a read/write buffer 308, a memory array 306 and a status register 310. Although not depicted, memory banks 304A-304D can further include respective row and column data interfaces for controlling memory operations associated with memory array 306, such as writing data to or reading data from memory array 306, erasing subsets of memory array 306, performing error control functionality, wear-leveling, and so on. Further, memory banks 304A-304D can comprise a state machine, or a set of state machines associated with subsets of memory banks 304A-304D, for organizing or monitoring operation activity, initiating replies to completed operations, and so forth.

Bus/interface 320 can be associated with a communication protocol and related control logic. The communication protocol and control logic can be configured to map information transmitted over bus/interface 320 to various functions, operations, configurations, etc., of memory 302. In some embodiments, the communication protocol can be utilized to identify one of a set of mode registers 310, and an operation associated therewith. As depicted, mode registers 310 can comprise mode register$_0$ 312, through mode register$_Z$ 318, which can additionally comprise at least an index register$_n$ 314 and a status-related mode register$_{n+m}$ 316. When an address of status-related mode register 316 is specified in a command (also referred to as a status-related command), status logic of memory device 302 can be implemented in conjunction with the command. In such embodiment, the status logic can include an ad-hoc mapping between subsets of status registers 310 of memory banks 304A-404D, providing an identifier for respective subsets thereof. The status logic can also direct memory device 302 to retrieve an identifier from index register 314 in response to receiving a status-related command (e.g., specifying the mode address of status-related mode register 316), to identify a target status register(s) or subsets of status registers 310 of memory banks 304A-304D. A status command operation included in the status-related command can then be performed on the target status register(s) 310. A second status-related command can include a mode address of index register 314. In response to receiving the second status-related command, memory device 302 can decode an identifier of a status register(s) 310 and write the decoded identifier to index register 314. Accordingly, subsequent status-related commands will be implemented with respect to status register(s) associated with the decoded identifier. By using successive second status-related commands, different target status registers 310 can be selected as targets for status-related command.

By accessing index register 314 or status-related mode register 316, a host can obtain status register-specific (or status information specific to a subset of status registers 310) information for any of status registers 310, reset any of status registers 310, or perform other status-related operations on any of status registers 310. Moreover, the addition of index register 314 for storing identifiers to respective ones (or subsets) of status registers 310 can enable memory bank-specific status information, utilizing a standard bus/interface 320 (e.g., an LPDDR3 bus) and associated standard communication protocol (e.g., an LPDDR3 communication protocol), in at least some disclosed embodiments. In various embodiments, memory device 302 can provide significant benefits, for instance, availability of bank-specific pass/fail information, bank-specific busy/idle information, bank-specific ECC information, and so forth, without little or no overhead associated with adapting bus/interface 320 or the associated communication protocol to provide these functions.

In a further embodiment, a miscellaneous bus 322 can be communicatively connected with memory device 302. Miscellaneous bus 322 can provide global status information, in an embodiment, as well as reset or other input functions for global status information. In an alternative embodiment, one of mode registers 310 can be provide global status information for memory banks 304, e.g., in response to a host query.

Figure 4:
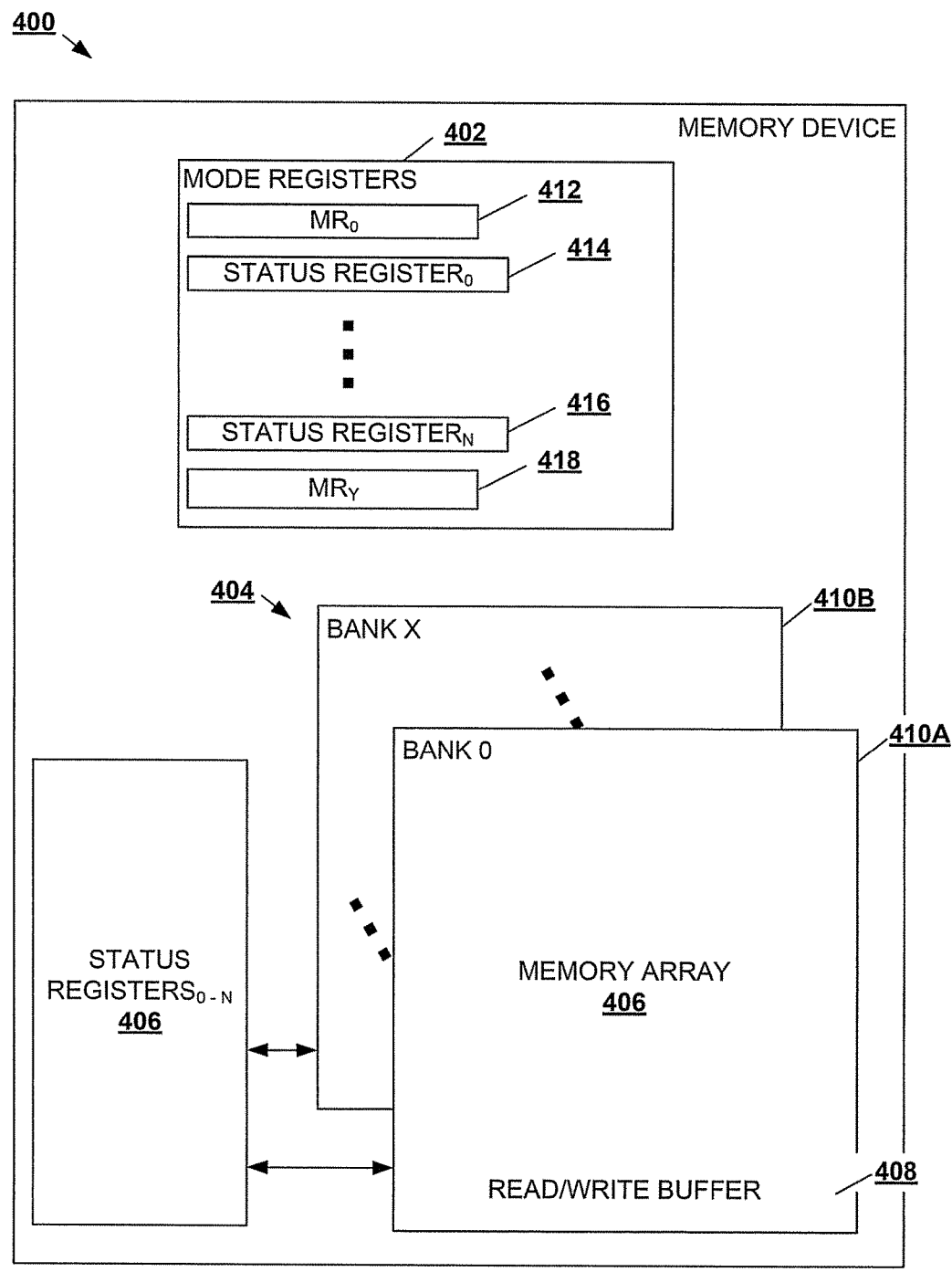
FIG. 4 depicts a block diagram of a sample memory device that provides individual addressability for the set of status registers in an alternative embodiment.

Referring now to FIG. 4, there is depicted a memory device 400 according to additional embodiments of the present disclosure. Memory device 400 can comprise a set of multiple memory banks 404, a set of mode registers 402, and a set of status registers 406. Memory banks 404 include a first memory bank 410A, through an $X^{th}$ memory bank 410B, where X is a suitable positive integer greater than one. Respective memory banks 404 can comprise a read/write buffer 408 and a memory array 410. In some embodiments, memory array 410 can comprise non-volatile memory. For instance, the non-volatile memory can include two-terminal non-volatile memory (e.g., resistive memory, phase-change memory, conductive-bridging memory, and so on), or can comprise NAND or NOR memory in other embodiments. As another example, memory array 410 can comprise volatile memory (e.g., DRAM, synchronous DRAM (SDRAM), double data rate (DDR)-SDRAM, DDR2-SDRAM, and so forth).

Status registers 406 can include status register$_0$ through status register$_N$, where N can be a suitable positive integer greater than 1. In some embodiments, N can be equal to X, so that an equivalent number of status registers 406 are provided for memory banks 404. In other embodiments, more or fewer status registers 406 can be provided (e.g., N>X, N<X) for memory banks 404. Where an equivalent number of status registers 406 are provided as memory banks 404, each status register 406 can be associated with respective ones of memory banks 404. Where fewer status registers 406 are provided, at least one status register can be associated with a plurality of memory banks 404.

Status registers 406 can store status-related information pertaining to respective subsets of memory banks 404. As provided herein, status-related information can include, but is not limited to, program pass/fail status, read pass/fail status, a busy/idle status, an ECC pass/fail status, or the like, or a suitable combination of the foregoing. Additionally, status registers 406 can be mapped to respectively to a subset of status-related mode registers 402 of memory device 200. Mode registers can include mode register$_0$ 412 through mode register$_Y$ 418, where Y is a suitable integer greater than three. The subset of status-related mode registers include status-related mode register$_0$ 414 mapped to status register$_0$, through status-related mode register 416 mapped to status register$_N$. A command received by memory device 200, and specifying an address of one of mode registers 414, 416 can cause memory device 200 to implement a status operation with respect to a mapped one of status registers$_{0-N}$ 406. Such an operation can retrieve status information from a mapped status register 406, clear status information from the mapped status register 406, or the like, facilitating bank-specific (or subset-specific) status operations (e.g., status information retrieval) related to subsets of memory banks 404. In an embodiment, mode registers 402 have addresses consistent with a standard bus/interface protocol associated with a standard bus/interface (not depicted) of memory device 400. Accordingly, the bank-specific status information can be output by memory device 400 utilizing a standard bus/interface and standard communication protocol (e.g., an LPDDR3 bus/interface and protocol, and others). In another embodiment, mode registers 402 can exceed an addressing space of a standard communication bus/interface or communication protocol. In this embodiment, an extended bus/interface can be provided having additional pins added to the standard bus/interface, and an extended addressing space added to the communication protocol to define, manage and operate data transmitted via these additional pins (e.g., see FIG. 6, infra). Accordingly, by providing an extended bus/interface and protocol, additional mode registers (e.g., status-related mode registers) can be accessed and controlled over and above those defined for the standard bus/interface and protocol. In this embodiment, memory device 400 can comprise a greater number of memory banks 404, status registers 406 and mode registers 402 than are addressed by the standard bus and protocol, and still facilitate storing and accessing of per-bank status information for the number of memory banks 404.

FIG. 5 illustrates a block diagram of an example memory bus/interface 502 and global status bus 506 according to alternative or additional embodiments of the subject disclosure. As depicted, memory bus/interface 502 can comprise a set of bus control pins 504, having associated functions therewith. Bus control pins 504 can comprise, starting from the top, a chip select pin for selecting one of a set of memory chips, a clock pin (e.g., clock_t, etc.) for transferring command information in response to a clock signal, and inverted clock pin (e.g., clock_n, and so forth) for transferring command information in response to an inverted clock signal (e.g., a signal that is a logical inversion of the clock signal). Additionally, a clock enable pin is provided. Below the clock enable pin is a set of pins [0:X], where X is a suitable positive number, for command address inputs, and a set of data bus input/output pins [0:N], where N is a suitable positive number, for transferring data to or receiving data from a selected memory chip on a data bus. Additionally, a data mask pin is provided for specifying a data mask to the memory chip in conjunction with a memory operation (which can include a status operation). Input/output pins are provided for bi-directional data strobe features: DQS0 and DQS0# of the memory device (utilized, e.g., as input centered with write data and an edge-aligned output with read data). Below the DQS input/output pins are a set of data input/output pins [A:B], where A and B are respective positive numbers, and a second data mask pin input for a second data mask. A data strobe input/output pin (DQS1) is provided, as well as a complementary data strobe (DQS1') input/output pin.

Global status bus 506 can comprise a set of global status pins 508. Starting from a top of global status bus 506, there is a reset input pin for resetting global status pins 508. A busy output pin can indicate any of a set of memory banks are performing operations or have queued operations. A program fail pin can indicate whether a program failure has been detected for any of the set of memory banks, and an erase fail pin can indicate whether an erase failure has been detected for any of the set of memory banks. Likewise, an ECC fail pin can indicate whether an ECC correction has occurred for any of the set of memory banks. Additionally, an on die termination input pin is provided, as well as a ZQ input pin.

It should be appreciated that memory bus/interface 502 and bus control pins 504, as well as global status bus 506 and global status pins 508 are provided as examples. These examples can be included for a disclosed memory device or chip level infrastructure disclosed herein, where suitable. However, other bus/interfaces and associated control pins, or global status and associated status pins, having different arrangements, functions, inputs, outputs, or inputs/outputs can be implemented with various disclosed memory devices or chip level infrastructures within the scope of the present disclosure, as is known in the art or made known to one of skill in the art by way of the context provided herein.

FIG. 6 illustrates a diagram of an example mode register communication protocol 600 according to further embodiments of the present disclosure. In some embodiments, communication protocol 600 can be an extension of a LPDDR3 communication protocol. For instance, where a LPDDR3 bus has 10 command and address pins, CA00-CA09, communication protocol 600 can be operative for an extended bus having command and address pins CA00-CA 14. Communication protocol 600 is configured to provide bank-specific identifiers for a set of status registers, for performing operations on respective ones of the status registers, such as retrieving bank-specific status information. It should be appreciated that additional protocols can be provided for memory operation functions including pins CA10-CA14 in addition to the CA00-CA09 pins. Such protocols, though not specified here, can include issuing memory operations to specific banks of memory, as one example.

Communication protocol 600 includes an example mode register write 604 operation and mode register read 606 operation, utilizing a set of command addresses comprising addresses CA00 through CA14, parsed for a rising edge (up arrow, on right) and falling edge (down arrow, on right) of a clock signal. Referring first to mode register write 604, on the rising clock edge, CA addresses CA00-CA03 having low (L) values indicate a mode register write operation. For the write operation, addresses CA04-CA09 of the rising clock edge, and addresses CA00-CA01 on the falling clock edge are mode register identifier bits. The mode register identifier bits provide 8 bits (256 unique binary identifiers) to indicate a mode register of a set of mode registers. For a status-related write command, an address of a status-related mode register can be specified by the mode register identifier bits to initiate the status-related write command. Additionally, addresses CA10-CA14 on the rising clock edge and falling edge of the clock are memory bank address bits, 10 bits in total (1024 unique binary identifiers) identifying a particular memory bank (or status register associated with the memory bank) for performing the status-related write command. On the falling clock edge (down arrow), in addition to those described above, command addresses CA02-CA09 are provided as operation value bits. The operation value bits can specify a command value to be written to a target mode register, or a target status register if the status-related mode register is identified by the mode register identifier bits (CA04-CA09 rising and CA00-CA01 falling).

Referring now to mode register read 606, command addresses CA00-CA03 being low, low, low and high, respectively, indicate a mode register read operation. Similar to mode register write 604, command addresses CA04-CA09 on the rising edge and command addresses CA00-CA01 on the falling clock edge are mode register identifier bits, and command addresses CA10-CA14 on both the rising edge and falling edge are memory bank address (or status register address) identifier bits. In one embodiment, operation value bits can be ignored (Xs) for mode register read 606, and data included in an identified memory bank or status register can simply be read out. In another embodiment, operation value bits CA02-CA09 can include a command value identifying a subset of status information desired to be read out, such as busy/idle information for the targeted memory bank, program fail information for the targeted memory bank, erase fail information for the targeted memory bank, ECC fail information for the targeted memory bank, or other stored status-related information, or suitable combinations of the foregoing.

The aforementioned diagrams have been described with respect to interaction between several components of an electronic device, a host, an interface, or memory architecture. It should be appreciated that in some suitable alternative aspects of the subject disclosure, such diagrams can include those components, devices, architectures, etc., specified therein, some of the specified components/devices/architectures, or additional components/devices/architectures. Sub-components can also be implemented as connected to other sub-components rather than included within a parent component. For example, multiple memory banks can be provided on separate memory chips, instead of on a single chip. Additionally, it is noted that one or more disclosed processes can be combined into a single process providing aggregate functionality. Components of the disclosed devices/architectures can also interact with one or more other components not specifically described herein but known by those of skill in the art.

In view of the exemplary diagrams described supra, process methods that can be implemented in accordance with the disclosed subject matter will be better appreciated with reference to the flow charts of FIGS. 7-11. While for purposes of simplicity of explanation, the methods of FIGS. 7-11 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that some or all of the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 7:
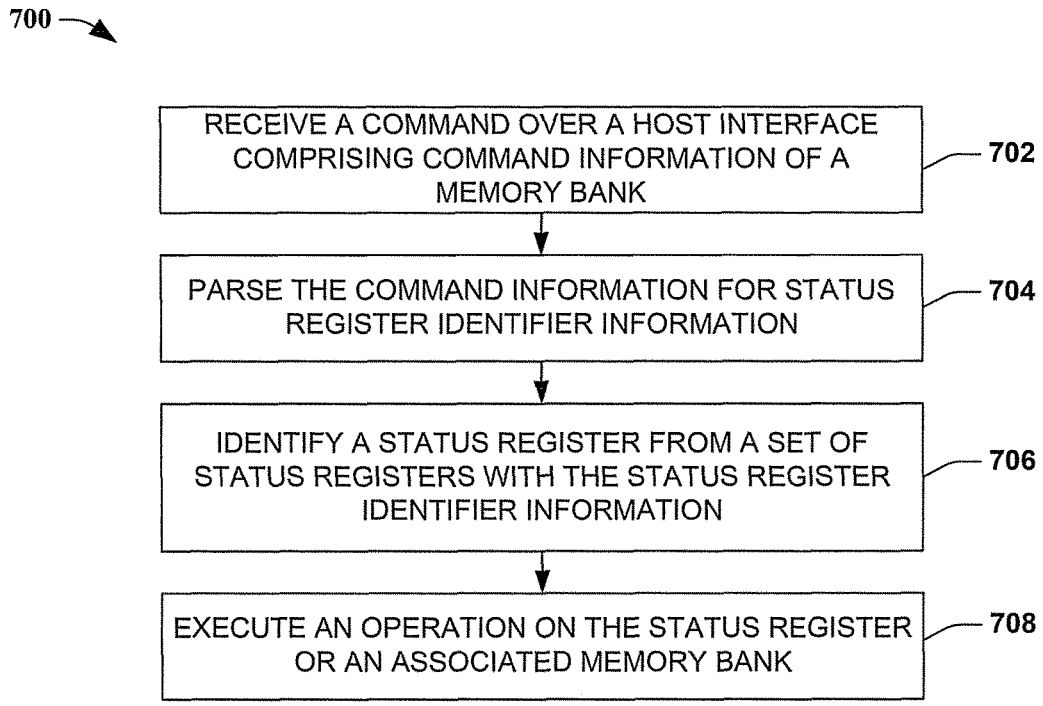
FIG. 7 illustrates a flowchart of an example method for operating an electronic memory, according to an embodiment.

FIG. 7 illustrates a flowchart of an example method 700 according to additional embodiments of the subject disclosure. At 702, method 700 can comprise receiving a command over a host interface, the command comprising command information related to a memory bank of a set of memory banks of a memory device. At 704, method 700 can comprise parsing the command information and determining whether a status register identifier information is indicated by the command. Further, at 706, method 700 can comprise identifying a status register of a set of status registers with reference to the status register identifier information, in response to determining the status register identifier information is indicated by the command. Moreover, at 708, method 700 can comprise executing an operation on the status register or on the memory bank in response to receiving the command and identifying the status register.

According to further embodiments, method 700 can comprise utilizing the status register identifier information to distinguish the status register from other status registers of the set of status registers. Further, in conjunction with executing the operation on the status register, method 700 can comprise retrieving status information data from the status register, wherein the status information data pertains to an operation status of the memory bank and is independent of a second operation status of a second memory bank of the set of memory banks. Method 700 can additionally comprise sending reply data over the host interface in response to the command, the reply data comprising the status information data. In an embodiment, parsing the command information can further comprise accessing addressing information indicative of respective status registers of the set of status registers, and employing an extended address space of a communication protocol in conjunction with accessing the address information indicative of the respective status registers. In one embodiment, method 700 can comprise employing an extended address space of a LPDDR3 communication protocol for accessing the address information indicative of the respective status registers.

According to alternative or additional embodiments of method 700, parsing the command information can further comprise accessing address information indicative of a status-related mode register of the set of status-related mode registers of the memory device, and determining the status register identifier information by retrieving status register identifier information from the status-related mode register. In an embodiment, the set of status-related mode registers can be addressed via a mode register address of an LPDDR3 protocol, or can be addressed in part by an extended address space of a modified LPDDR3 protocol.

In still other alternative embodiments, method 700 can perform parsing the command information by obtaining an index register instruction from the command information, accessing an index register of the memory device in response to the index register instruction, and reading the status register identifier information from the index register. In a further embodiment, executing the operation on the status register can be in response to reading the status register identifier information from the index register.

Figure 8:
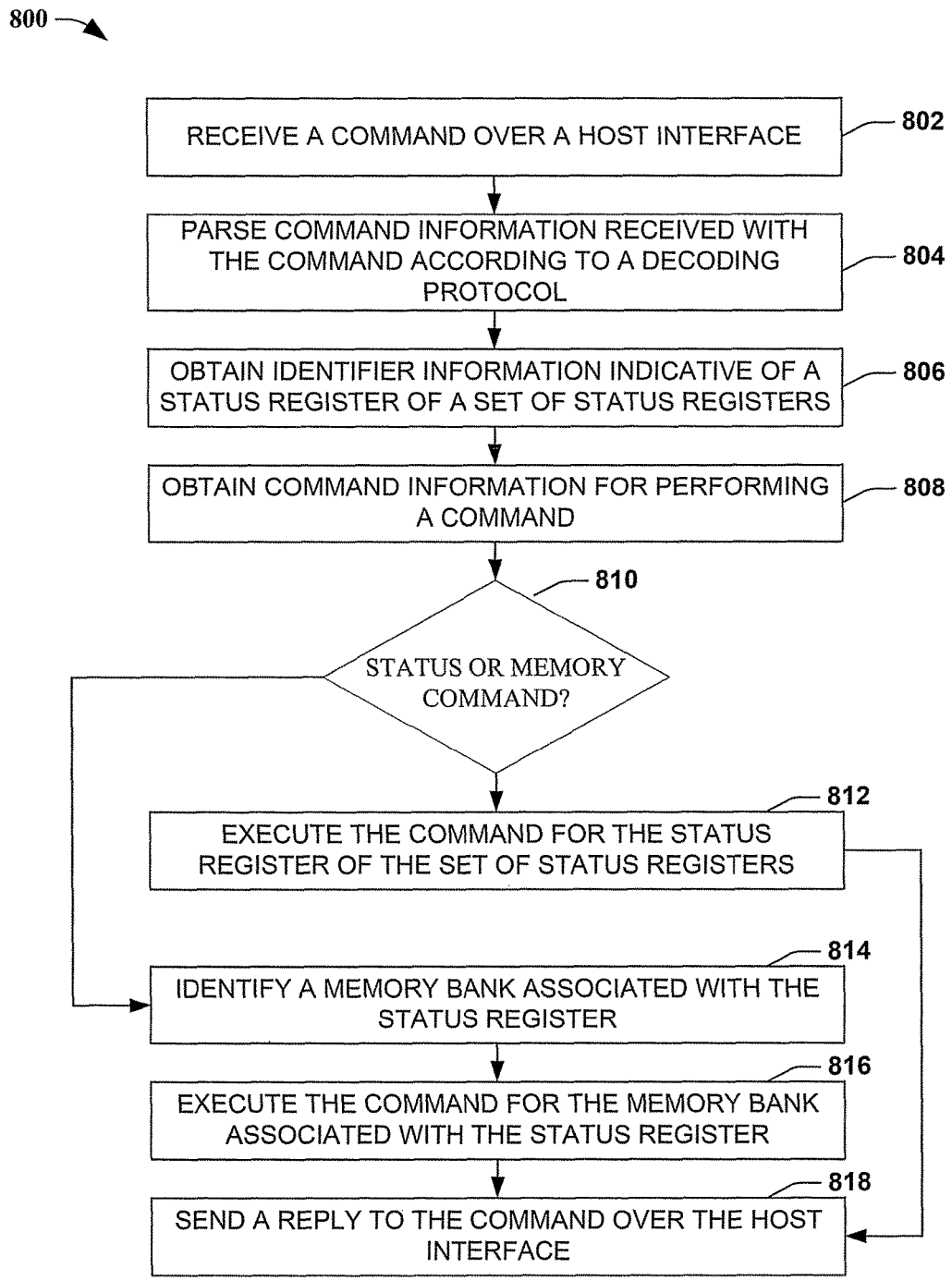
FIG. 8 depicts a flowchart of an example method for providing status feedback for a multi-bank memory, in further embodiments.

Referring to FIG. 8, a flowchart of an example method 800 according to further embodiments of the subject disclosure is depicted. At 802, method 800 can comprise receiving a command over a host interface. At 804, method 800 can comprise parsing command information received with the command according to a decoding protocol associated with the host interface. At 806, method 800 can comprise obtaining identifier information indicative of a status register of a set of status registers from the command. At 808, method 800 can comprise obtaining command information from the command related to performing an operation in response to the command. At 810, a determination is made as to whether the operation is a status command operation or a memory command operation. In response to determining the operation is a status command operation, method 800 can proceed to 812; otherwise method 800 can proceed to 814.

At 812, method 800 can comprise executing the command for the status register of the set of status registers. From 812, method 800 can proceed to 818. At 814, method 800 can comprise identifying a memory bank associated with the status register in response to determining the operation is a memory command operation. At 816, method 800 can comprise executing the command for the memory bank associated with the status register. At 818, method 800 can comprise sending a reply to the command over the host interface.

Figure 9:
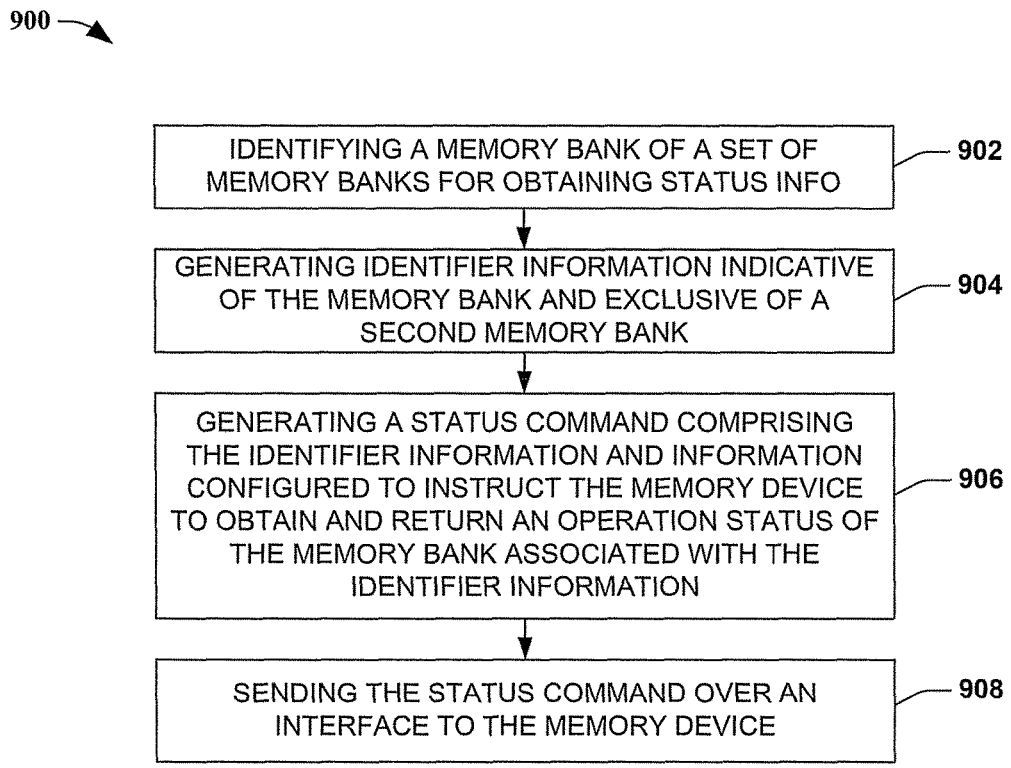
FIG. 9 illustrates a flowchart of a sample method for accessing bank-specific status information over a memory interface, in an embodiment.

FIG. 9 depicts a flowchart of an example method 900 for acquiring status information for a memory bank of a memory device, according to a further embodiment. At 902, method 900 can comprise identifying a memory bank of a set of memory banks for obtaining status information. At 904, method 900 can comprise generating identifier information indicative of the memory bank and exclusive of a second memory bank of the set of memory banks. In addition, at 906, method 900 can comprise generating a status command comprising the identifier information and information configured to instruct the memory device to obtain and return an operation status of the memory bank associated with the identifier information. Further, at 908, method 900 can comprise sending the status command over an interface to the memory device.

In an additional embodiment, method 900 can further comprise receiving a reply to the status command, the reply comprising information indicative of the operation status of the memory bank associated with the identifier information. Additionally, method 900 can comprise generating a set of bank-specific command information configured to cause one memory bank of the set of memory banks to perform a memory operation, including the identifier information with the bank-specific command information, and transmitting the bank-specific command information over the interface to the memory device. Generating the bank-specific command information can be in response to receiving the reply to the status command, wherein the reply comprises information indicative of a non-busy state of the memory bank.

In one or more additional embodiments, method 900 can comprise generating second identifier information indicative of the second memory bank and exclusive of the first memory bank of the set of memory banks. Method 900 can additionally comprise generating a second status command comprising the second identifier information and information configured to instruct the memory device to obtain and return a second operation status of the second memory bank associated with the second identifier information. Further to this embodiment(s), method 900 can comprise sending the status command over the interface to the memory device, and receiving a reply comprising the operation status of the memory bank or the second operation status of the second memory bank, in response to sending the status command and sending the second status command. In still other embodiments, method 900 can comprise generating bank-specific command information comprising the identifier information in response to the reply comprising status data indicating the memory bank is in a non-operative state, or can comprise generating the bank-specific command information comprising the second identifier information in response to the reply comprising status data indicating the second memory bank is in the non-operative state. In a further embodiment, method 900 can comprise delaying for a delay period in response to the operation status or the second operation status comprising status data indicative of a busy state, and resending the status command or the second status command after determining that the delay period is expired.

Figure 10:
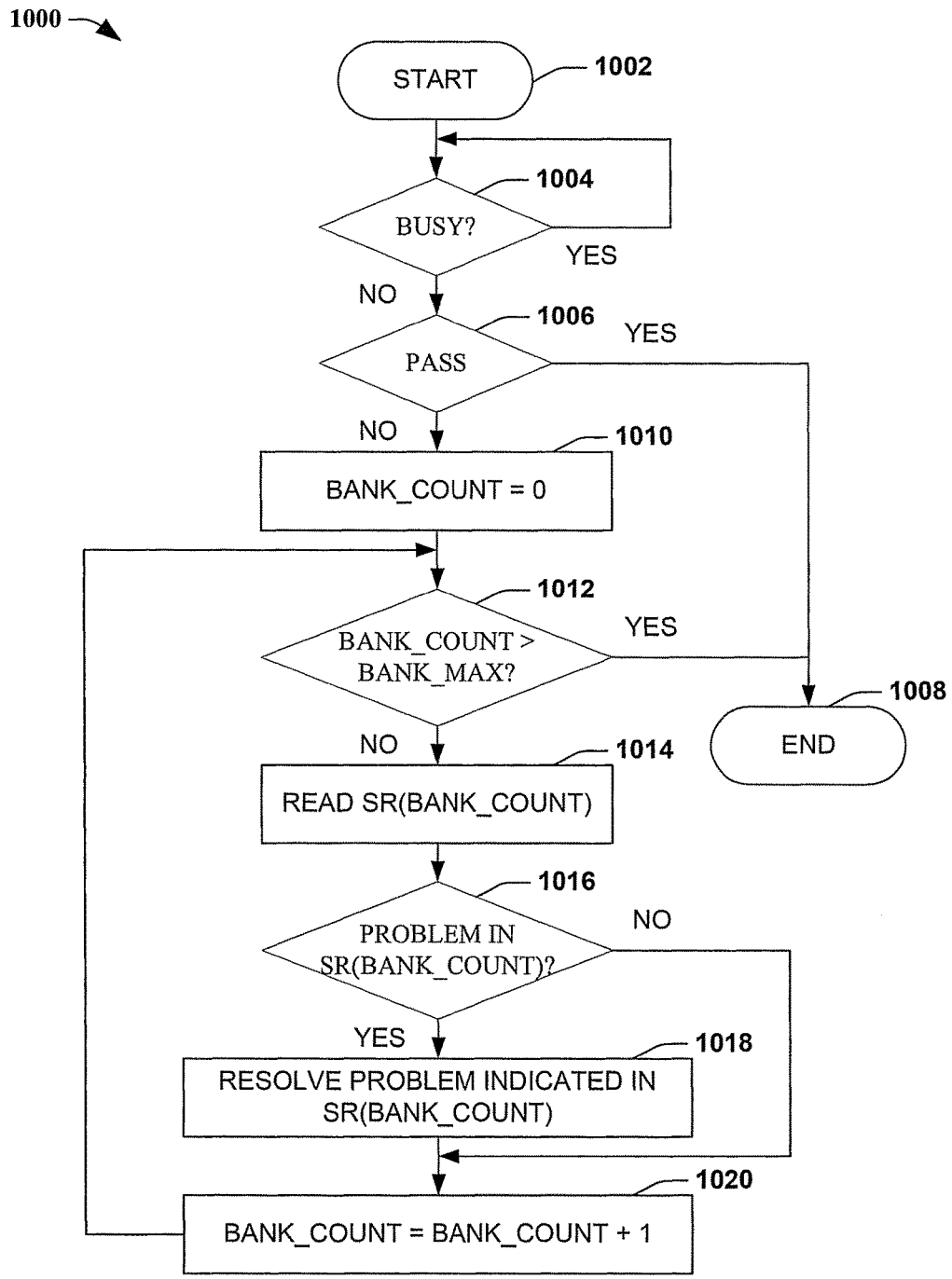
FIG. 10 depicts a flowchart of a sample method for outputting bank-specific status information for multiple banks of a memory device, in an embodiment.

Referring to FIG. 10, a flowchart is illustrated of an example method 1000 for acquiring bank-specific status information from a memory device comprising multiple banks of memory. At 1002, method 1000 can start, and at 1004 method 1000 can determine whether a global status indicator of the memory device indicates the memory device is busy. If busy, method 1000 can repeat the determination at 1004, otherwise method 1000 can proceed to 1006. At 1006, method 1000 can determine whether an error is identified by a global error status indicator. If no global error is determined, method 1000 can proceed to 1008 and end; otherwise, if a global error is determined, method 1000 can proceed to 1010.

At 1010, method 1000 can initiate a variable bank_count=0. At 1012, method 1000 can determine whether variable bank_count has a value greater than a bank_max value. If the value is greater than bank_max value, method 1000 can return to 1008 and end; otherwise method 1000 proceeds to 1014. At 1014, method 1000 can read status information from status register associated with a current value of bank_count. At 1016, method 1000 can determine whether the status information for the status register having the current value of bank_count indicates an error. If the status information indicates an error, method 1000 can proceed to 1018; otherwise, method 1000 proceeds to 1020.

At 1018, method 1000 can resolve the error indicated in the status register having the current value of bank_count. At 1020, method 1000 can increment the current value of bank_count by one. From 1020, method 1000 can return to reference number 1012, and continue from there.

Figure 11:
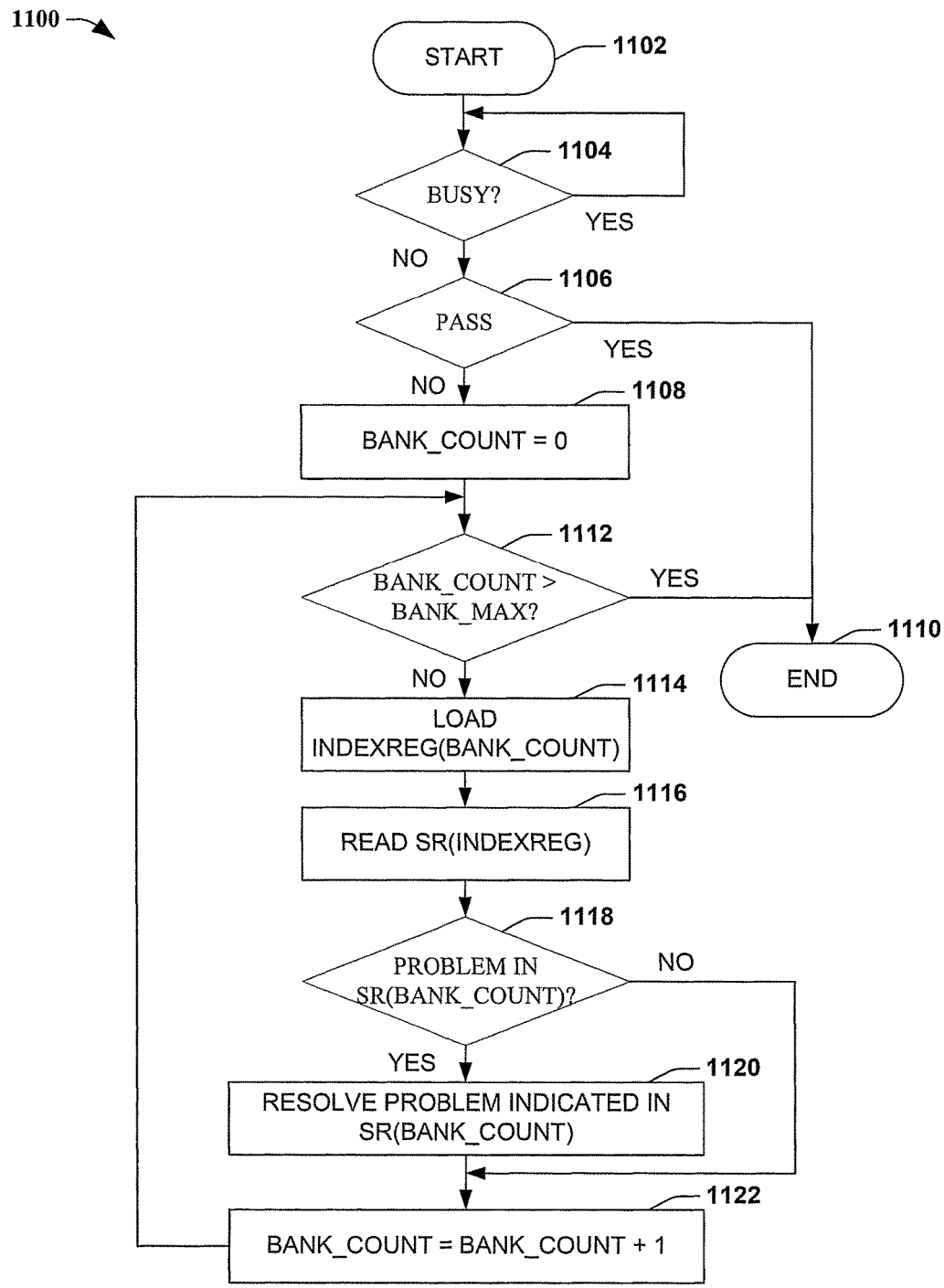
FIG. 11 illustrates a flowchart of a sample method for providing bank-specific status information over a standard communication protocol.

FIG. 11 illustrates a flowchart of an example method 1100 for obtaining status information from a memory device comprising multiple memory banks, according to alternative or additional embodiments of the present disclosure. At 1102, method 1100 can start, and at 1104 method 1100 can determine whether a global status indicator of the memory device indicates the memory is busy. If busy, method 1100 can return to 1104; otherwise method 1100 can proceed to 1106 and determine whether a global status indicator of the memory device indicates a failure event. If the failure event is indicated, method 1100 can proceed to 1108; otherwise, method 1100 ends at 1110.

At 1108, method 1100 can initiate a variable bank_count=0. At 1112, method 1100 can comprise a determination as to whether a current value of bank_count is greater than a bank_max value. If the current value is greater than bank_max, method 1100 can end at 1110; otherwise method proceeds to 1114. At 1114, method 1100 can comprise loading an index register value for an index register associated with the current value of bank_count. At 1116, method 1100 can read status information from a status register associated with the index register value. At 1118, method 1100 can comprise determining whether the status information indicates an error for a memory bank mapped to the status register associated with the index register value. If no error is determined, method 1100 can proceed to 1122; otherwise method 1100 proceeds to 1120.

At 1120, method 1100 can comprise resolving the error for the memory bank mapped to the status register associated with the index register value. At 1122, method 1100 can comprise incrementing the current value of bank_count by one. Method 1100 can return to 1112 and proceed from there.

In various embodiments of the subject disclosure, disclosed memory or memory architectures can be employed as a standalone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing.

Figure 12:
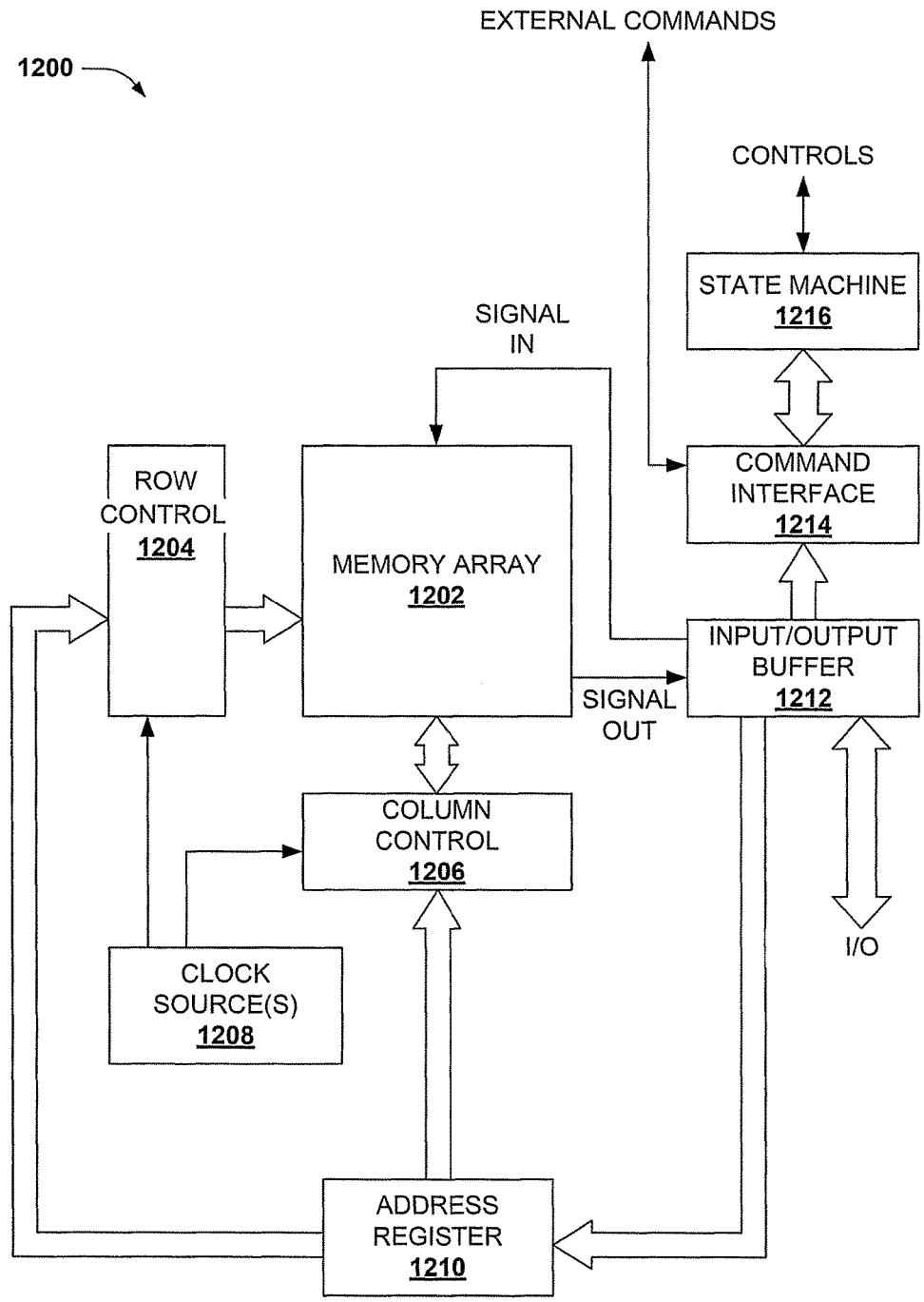
FIG. 12 depicts a block diagram of an example operating and control environment for a memory device according to disclosed embodiments.

In order to provide a context for the various aspects of the disclosed subject matter, FIG. 12, as well as the following discussion, is intended to provide a brief, general description of a suitable environment in which various aspects of the disclosed subject matter can be implemented or processed. While the subject matter has been described above in the general context of electronic memory or architectures and process methodologies for operating such memory or architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer (e.g., computer 1302 of FIG. 13, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone electronic devices, such as a memory card, Flash memory module, removable memory, or the like. In a distributed computing environment, program modules can be located in both local and remote memory storage modules or devices.

FIG. 12 illustrates a block diagram of an example operating and control environment 1200 for a memory cell array 1202 according to aspects of the subject disclosure. In at least one aspect of the subject disclosure, memory cell array 1202 can comprise a variety of memory cell technology. In at least one embodiment, memory cells of the memory cell technology can comprise two-terminal memory, arranged in a compact two or three dimensional architecture, as described herein. In another embodiment, memory cell array 1202 can store operations configured to obtain bank-specific status information from a disclosed memory device.

A column controller 1206 can be formed adjacent to memory cell array 1202. Moreover, column controller 1206 can be electrically coupled with bit lines of memory cell array 1202. Column controller 1206 can control respective bitlines, applying suitable program, erase or read voltages to selected bitlines.

In addition, operating and control environment 1200 can comprise a row controller 1204. Row controller 1204 can be formed adjacent to column controller 1206, and electrically connected with word lines of memory cell array 1202. Row controller 1204 can select particular rows of memory cells with a suitable selection voltage. Moreover, row controller 1204 can facilitate program, erase or read operations by applying suitable voltages at selected word lines.

A clock source(s) 1208 can provide respective clock pulses to facilitate timing for read, write, and program operations of row controller 1204 and column controller 1206. Clock source(s) 1208 can further facilitate selection of word lines or bit lines in response to external or internal commands received by operating and control environment 1200. An input/output buffer 1212 can be connected to an external host apparatus, such as a computer or other processing device (not depicted, but see e.g., computer 1302 of FIG. 13, infra) by way of an I/O buffer or other I/O communication interface. Input/output buffer 1212 can be configured to receive write data, receive an erase instruction, output readout data, and receive address data and command information, as well as address data for respective instructions. Address data can be transferred to row controller 1204 and column controller 1206 by an address register 1210. In addition, input data is transmitted to memory cell array 1202 via signal input lines, and output data is received from memory cell array 1202 via signal output lines. Input data can be received from the host apparatus, and output data can be delivered to the host apparatus via the I/O buffer.

Commands received from the host apparatus can be provided to a command interface 1214. Command interface 1214 can be configured to receive external control signals from the host apparatus, and determine whether data input to the input/output buffer 1212 is write data, a command, or an address. Input commands can be transferred to a state machine 1216.

State machine 1216 can be configured to manage programming and reprogramming of memory cell array 1202. State machine 1216 receives commands from the host apparatus via input/output buffer 1212 and command interface 1214, and manages read, write, erase, data input, data output, and similar functionality associated with memory cell array 1202. In some aspects, state machine 1216 can send and receive acknowledgments and negative acknowledgments regarding successful receipt or execution of various commands.

To implement read, write, erase, input, output, etc., functionality, state machine 1216 can control clock source(s) 1208. Control of clock source(s) 1208 can cause output pulses configured to facilitate row controller 1204 and column controller 1206 implementing the particular functionality. Output pulses can be transferred to selected bit lines by column controller 1206, for instance, or word lines by row controller 1204, for instance.

In connection with FIG. 13, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 13:
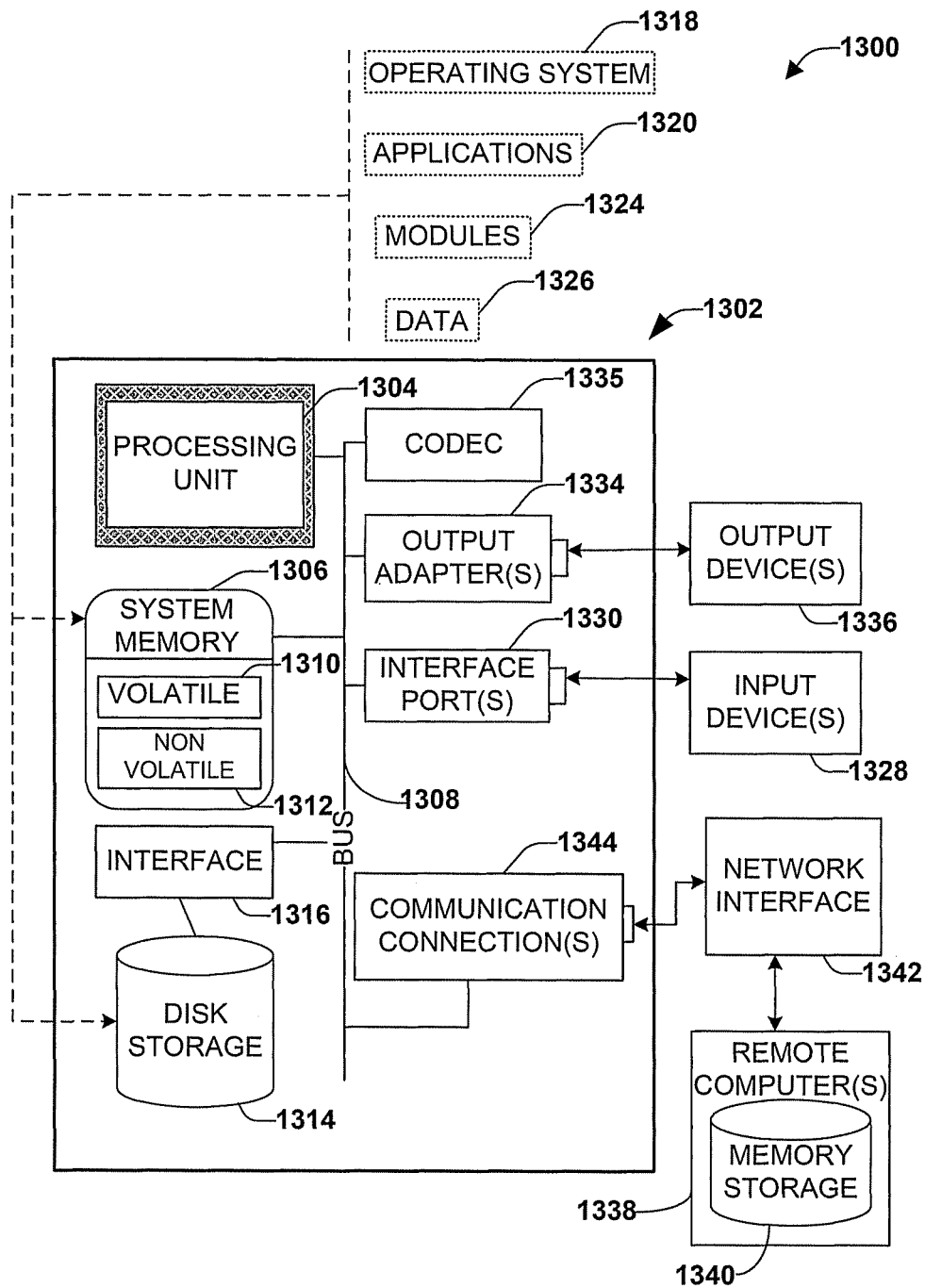
FIG. 13 illustrates a block diagram of an example computing environment that can be implemented in conjunction with various embodiments.

With reference to FIG. 13, a suitable operating environment 1300 for implementing various aspects of the claimed subject matter includes a computer 1302. The computer 1302 includes a processing unit 1304, a system memory 1306, a codec 1335, and a system bus 1308. The system bus 1308 couples system components including, but not limited to, the system memory 1306 to the processing unit 1304. The processing unit 1304 can be any of various available processors. Dual microprocessors and other multiprocessor architectures also can be employed as the processing unit 1304.

The system bus 1308 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1306 includes volatile memory 1310 and non-volatile memory 1314, which can employ one or more of the disclosed memory architectures, in various embodiments. The basic input/output system (BIOS), containing the basic routines to transfer information between elements within the computer 1302, such as during start-up, is stored in non-volatile memory 1312. In addition, according to present innovations, codec 1335 may include at least one of an encoder or decoder, wherein the at least one of an encoder or decoder may consist of hardware, software, or a combination of hardware and software. Although, codec 1335 is depicted as a separate component, codec 1335 may be contained within non-volatile memory 1312. By way of illustration, and not limitation, non-volatile memory 1312 can include read only memory (ROM), programmable ROM (PROM), electrically programmable ROM (EPROM), electrically erasable programmable ROM (EEPROM), or Flash memory. Non-volatile memory 1312 can employ one or more of the disclosed memory architectures, in at least some disclosed embodiments. Moreover, non-volatile memory 1312 can be computer memory (e.g., physically integrated with computer 1302 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1310 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1302 may also include removable/non-removable, volatile/non-volatile computer storage medium. FIG. 13 illustrates, for example, disk storage 1314. Disk storage 1314 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1314 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1314 to the system bus 1308, a removable or non-removable interface is typically used, such as interface 1316. It is appreciated that disk storage 1314 can store information related to a user. Such information might be stored at or provided to a server or to an application running on a user device. In one embodiment, the user can be notified (e.g., by way of output device(s) 1336) of the types of information that are stored to disk storage 1314 and/or transmitted to the server or application. The user can be provided the opportunity to opt-in or opt-out of having such information collected and/or shared with the server or application (e.g., by way of input from input device(s) 1328).

It is to be appreciated that FIG. 13 describes software that acts as an intermediary between users and the basic computer resources described in the suitable operating environment 1300. Such software includes an operating system 1318. Operating system 1318, which can be stored on disk storage 1314, acts to control and allocate resources of the computer 1302. Applications 1320 take advantage of the management of resources by operating system 1318 through program modules 1324, and program data 1326, such as the boot/shutdown transaction table and the like, stored either in system memory 1306 or on disk storage 1314. It is to be appreciated that the claimed subject matter can be implemented with various operating systems or combinations of operating systems.

A user enters commands or information into the computer 1302 through input device(s) 1328. Input devices 1328 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1304 through the system bus 1308 via interface port(s) 1330. Interface port(s) 1330 include, for example, a serial port, a parallel port, a game port, and a universal serial bus (USB). Output device(s) 1336 use some of the same type of ports as input device(s) 1328. Thus, for example, a USB port may be used to provide input to computer 1302 and to output information from computer 1302 to an output device 1336. Output adapter 1334 is provided to illustrate that there are some output devices, such as monitors, speakers, and printers, among other output devices, which require special adapters. The output adapter 1334 can include, by way of illustration and not limitation, video and sound cards that provide a means of connection between the output device 1336 and the system bus 1308. It should be noted that other devices and/or systems of devices provide both input and output capabilities such as remote computer(s) 1338.

Computer 1302 can operate in a networked environment using logical connections to one or more remote computers, such as remote computer(s) 1338. The remote computer(s) 1338 can be a personal computer, a server, a router, a network PC, a workstation, a microprocessor based appliance, a peer device, a smart phone, a tablet, or other network node, and typically includes many of the elements described relative to computer 1302. For purposes of brevity, only a memory storage device 1340 is illustrated with remote computer(s) 1338. Remote computer(s) 1338 is logically connected to computer 1302 through a network interface 1342 and then connected via communication connection(s) 1344. Network interface 1342 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1344 refers to the hardware/software employed to connect the network interface 1342 to the system bus 1308. While communication connection 1344 is shown for illustrative clarity inside computer 1302, it can also be external to computer 1302. The hardware/software necessary for connection to the network interface 1342 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A memory device, comprising:
   a plurality of memory banks respectively comprising a memory array and a data buffer;

a first status register configured to store an active status or an idle status for a first subset of the plurality of memory banks;

a second status register configured to store a second active status or a second idle status for a second subset of the plurality of memory banks;

a data interface configured to receive commands from a host; and a memory controller configured to facilitate implementation of a bank-specific operation at the first status register or the second status register in response to receipt of a host command over the data interface;

wherein:

the first status register and the second status register are individually addressable by a status register addressing mechanism, the status register addressing mechanism is exposed to the host over the data interface, the data interface is a modified low power double data rate type 3 (LPDDR3) interface having a modification to the LPDDR3 interface comprising at least one additional command and address pin that provides an expanded address space for the status register addressing mechanism and facilitates distinguishing the first status register from the second status register.

2. The memory device of claim 1, wherein the memory controller is further configured to receive, on at least one physical data pin exclusive to command and address operations, a bank address included with the host command, and direct the bank-specific operation to the first status register or the second status register in response to the bank address.

3. The memory device of claim 1, further comprising an index register configured to store an address reference that identifies the first status register or the second status register in response to a second host command.

4. The memory device of claim 3, wherein the memory controller is further configured to access the index register in response to receipt of the host command, retrieve the stored address reference from the index register and direct the bank-specific operation to the first status register or to the second status register in response to the address reference.

5. The memory device of claim 1, further comprising a set of mode registers, wherein the first status register is mapped to a first mode register of the set of mode registers and the second status register is mapped to a second mode register of the set of mode registers.

6. The memory device of claim 5, wherein the memory controller is further configured to one of:

direct the bank-specific operation to the first status register in response to the host command including an address assigned to the first mode register; and direct the bank-specific operation to the second status register in response to the host command including a second address assigned to the second mode register.

7. The memory device of claim 1, further comprising a general busy/idle indicator configured to output from the memory device a busy indication in response to either the first status register or the second status register indicating the active status or the second active status, respectively.

8. The memory device of claim 7, wherein the general busy/idle indicator is a push-pull or an open drain device.

9. The memory device of claim 1, wherein the first status register is configured to store a fail status or a pass status for the first subset of the plurality of memory banks, and the second status register is configured to store a second fail status or a second pass status for the second subset of the plurality of memory banks.

10. The memory device of claim 9, further comprising a general pass/fail indicator configured to output a fail indication in response to either the first status register or the second status register indicating the fail status or the second fail status, respectively.

11. The memory device of claim 9, wherein the general pass/fail indicator is a push-pull or an open drain device.

12. The memory device of claim 9, further comprising a global status register configured to:

store a busy status for the memory device in response to either the first status register or the second status register indicating the active status or the second active status, respectively; and store a fail status for the memory device in response to either the first status register or the second status register indicating the fail status or the second fail status, respectively.

13. The memory device of claim 12, wherein the global status register is responsive to commands from the host over the data interface.

14. The memory device of claim 1, further comprising a modified LPDDR3 communication protocol that assigns a subset of the expanded address space to the first status register, and a second subset of the expanded address space to the second status register.

15. The memory device of claim 1, further comprising:

a set of status-related mode registers assigned respectively to ones of a set of status registers comprising the first status register and the second status register; and a modified LPDDR3 communication protocol that defines an addressing scheme delineating respective ones of the set of status-related mode registers, wherein the modified LPDDR3 interface comprises a set of additional command and address pins, including the at least one additional command and address pin, that facilitate read or write capability by the host device over the modified LPDDR3 interface to respective ones of the set of status-related mode registers defined by the addressing scheme of the modified LPDDR3 communication protocol.

16. The memory device of claim 1, further comprising a set of mode registers operable in conjunction with a modified LPDDR3 communication protocol associated with the LPDDR3 interface, wherein a subset of the set of mode registers—un-assigned within the LPDDR3 communication protocol—are assigned to the first status register and to the second status register, and further wherein the bank-specific operation can be directed to the first status register or to the second status register by an associated mode register write operation to an associated one of the subset of the set of mode registers.

17. The memory device of claim 1, wherein the modified LPDDR3 communication protocol adds an expanded address space to a standard LPDDR3 communication protocol.

18. The memory device of claim 1, the plurality of memory banks further comprising respective ones of a set of status registers, including the first status register and the second status register, respectively configured to store the active status or the idle status for an associated one of the plurality of memory banks.

19. The memory device of claim 18, wherein the set of status registers are respectively configured to store a program pass/fail status for the associated one of the plurality of memory banks.

20. The memory device of claim 18, wherein the set of status registers are respectively configured to store an erase pass/fail status for the associated one of the plurality of memory banks.

21. The memory device of claim 18, wherein the set of status registers are respectively configured to store an error correction code status for the associated one of the plurality of memory banks.

22. The memory device of claim 1, wherein the memory array comprises a two-terminal non-volatile memory array.

23. The memory device of claim 1, wherein the memory array comprises a dynamic random access memory.

24. A memory device, comprising:
a first bank of two-terminal non-volatile resistive switching memory, and a second bank of two-terminal non-volatile resistive switching memory configured to implement a memory operation independent of and at least in part concurrent with a separate memory operation implemented by the first bank;
a first status register associated with the first bank and configured to store first status information pertaining to the first bank;
a second status register associated with the second bank and configured to store second status information pertaining to the second bank;
a data interface for communication between the memory device and a host; and
a memory controller configured to acquire and output over the data interface the first status information from the first status register or the second status information from the second status register in response to a host command received over the data interface, the host command comprising address information identifying the first status register as a target of the host command, or identifying the second status register as the target of the host command, wherein:
the data interface is a modified low power double data rate type 3 (LPDDR3) interface having a modification to the LPDDR3 interface comprising at least one additional command and address pin that provides an expanded address space over which the memory controller receives the address information identifying the first status register as the target of the host command or identifying the second status register as the target of the host command.

25. The memory device of claim 24, wherein the address information is specified via one or more bits of data included within a communication protocol of the data interface.

26. The memory device of claim 25, wherein the interface is a modified LPDDR4 data interface having the at least one additional command and address pin that provides the expanded address space.

27. The memory device of claim 24, wherein the address information is incorporated within a mapping between one or more mode registers of the memory device and the first status register and the second status register.

28. The memory device of claim 27, wherein the memory controller is configured to interpret the address information identifying a first mode register of the one or more mode registers as identifying the first status register as the target of the host command, and to interpret the address information identifying a second mode register of the one or more mode registers as identifying the second status register as the target of the host command.

29. The memory device of claim 24, further comprising an index register, wherein the address information from the host command is stored at the index register in response to the host command.

30. The memory device of claim 29, wherein the memory controller reads the address information from the index register in conjunction with identifying the first status register or the second status register as the target of the host command.

31. A memory device, comprising:
a plurality of memory banks respectively comprising a memory array and a data buffer;
a first status register configured to store an active status or an idle status for a first subset of the plurality of memory banks;
a second status register configured to store a second active status or a second idle status for a second subset of the plurality of memory banks;
a data interface configured to receive commands from a host and comprising a modified low power double data rate type 3 (LPDDR) interface having at least one additional command and address pin more than a standard LPDDR3 interface, wherein first status register and the second status register are individually addressable by a status register addressing mechanism that is exposed to the host over the data interface;
a memory controller configured to facilitate implementation of a bank-specific operation at the first status register or the second status register in response to receipt of a host command over the data interface;
a set of status-related mode registers assigned respectively to different sets of status registers, which respectively comprise the first status register and the second status register; and
a modified LPDDR3 communication protocol that defines an addressing scheme delineating respective ones of the set of status-related mode registers, wherein the data interface comprises a set of additional command and address pins, including the at least one additional command and address pin, that facilitate read or write capability by the host over the data interface to respective ones of the set of status-related mode registers defined by the addressing scheme of the modified LPDDR3 communication protocol.

32. The memory device of claim 31, further comprising a set of mode registers operable in conjunction with the modified LPDDR3 communication protocol associated with the data interface, wherein a subset of the set of mode registers—un-assigned within the LPDDR3 communication protocol—are assigned to the first status register and to the second status register, and further wherein the bank-specific operation can be directed to the first status register or to the second status register by an associated mode register write operation to an associated one of the subset of the set of mode registers.

33. The memory device of claim 32, wherein the modified LPDDR3 communication protocol adds an expanded address space to a standard LPDDR3 communication protocol.

* * * * *